United States Patent
Miyairi et al.

(10) Patent No.: US 8,299,467 B2
(45) Date of Patent: Oct. 30, 2012

(54) THIN FILM TRANSISTOR AND FABRICATION METHOD THEREOF

(75) Inventors: Hidekazu Miyairi, Kanagawa (JP); Ryu Komatsu, Kanagawa (JP); Takafumi Mizoguchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 21 days.

(21) Appl. No.: 12/977,479

(22) Filed: Dec. 23, 2010

(65) Prior Publication Data

US 2011/0156042 A1    Jun. 30, 2011

(30) Foreign Application Priority Data

Dec. 28, 2009 (JP) .................... 2009-297892

(51) Int. Cl.
*H01L 33/16* (2010.01)

(52) U.S. Cl. ... 257/59; 257/724; 257/296; 257/E33.053; 257/E21.414; 438/34; 438/158

(58) Field of Classification Search .............. 257/59, 257/E33.053, E21.414, 72, 296; 438/34, 438/158

See application file for complete search history.

(56) References Cited

U.S. PATENT DOCUMENTS

| 5,101,242 | A | 3/1992 | Ikeda et al. |
| 5,648,662 | A | 7/1997 | Zhang et al. |
| 5,864,150 | A | 1/1999 | Lin |
| 6,362,867 | B2 * | 3/2002 | Maeda .......... 349/187 |
| 7,199,846 | B2 | 4/2007 | Lim |
| 8,119,468 | B2 | 2/2012 | Miyairi et al. |
| 8,138,032 | B2 | 3/2012 | Miyairi et al. |

FOREIGN PATENT DOCUMENTS

| JP | 2005-049832 | 2/2005 |
| JP | 2005-167051 | 6/2005 |
| JP | 2009-278081 | 11/2009 |
| JP | 2009-278082 | 11/2009 |

* cited by examiner

*Primary Examiner* — Cuong Q Nguyen
*Assistant Examiner* — Cathy N Lam
(74) *Attorney, Agent, or Firm* — Nixon Peabody LLP; Jeffrey L. Costellia

(57) ABSTRACT

A thin film transistor is provided with a high crystallized region in a channel formation region and a high resistance region between a source and a drain, and thus has a high electric effect mobility and a large on current. The thin film transistor includes an "impurity which suppresses generation of crystal nuclei" contained in the base layer or located on its surface, a first wiring layer over a base layer, an impurity semiconductor layer over the first wiring, a semiconductor layer over the impurity semiconductor layer, the semiconductor layer comprises a crystalline region and a region containing an amorphous phase which is formed adjacent to the base layer.

8 Claims, 18 Drawing Sheets

100  102  104

152

106

154  156

THIN FILM TRANSISTOR AND FABRICATION METHOD THEREOF

BACKGROUND OF THE INVENTION

1. Field of the Invention

One embodiment of the present invention relates to a thin film transistor and a fabrication method thereof.

2. Description of the Related Art

In recent years, a thin film transistor (TFT) over a substrate having an insulating surface (e.g., a glass substrate) has been attracting attention. TFTs are widely used for integrated circuits (ICs) and electronic devices such as electro-optical devices. In an image display device such as a liquid crystal display device, a TFT formed using an amorphous semiconductor or a polycrystalline semiconductor is mainly used as a switching element.

In contrast, a TFT formed using a microcrystalline semiconductor for the channel formation region has been actively developed in recent years. For example, Patent Document 1 and Patent Document 2 disclose techniques for controlling nucleation positions and nucleation density in a microcrystalline semiconductor film.

REFERENCE

[Patent Document 1] Japanese Published Patent Application No. 2009-278081
[Patent Document 2] Japanese Published Patent Application No. 2009-278082

SUMMARY OF THE INVENTION

One embodiment of the present invention has an object to provide a TFT having a high switching property by increasing a resistance between a source and a drain.

A TFT which is one embodiment of the present invention includes a region containing an amorphous phase between a source and a drain in a semiconductor layer, a crystalline semiconductor region over the region containing an amorphous phase, and a gate electrode over the crystalline semiconductor region (on the side opposite to the substrate) which overlaps with at least a channel formation region with a gate insulating film interposed therebetween. That is, the TFT which is one embodiment of the present invention has a top gate structure.

It is preferable that, in the above TFT, a proportion of crystal grains and a crystal region in the semiconductor layer be large in the upper portion of the semiconductor layer, and small in the lower portion.

The semiconductor layer included in the TFT which is one embodiment of the present invention may be formed in such a manner that a semiconductor source gas and a dilution gas are mixed at a mixture ratio which enables a microcrystalline semiconductor to be formed in the presence of an "impurity which suppresses generation of crystal nuclei." For example, the condition in which the "impurity which suppresses generation of crystal nuclei" is present can be made by the following methods: 1) to make the "impurity which suppresses generation of crystal nuclei" present on a surface over which a semiconductor film is to be formed; 2) to add the "impurity which suppresses generation of crystal nuclei" in a film which has a surface over which the semiconductor film is to be formed; 3) to cover an inner wall of a reaction chamber used for forming the semiconductor film with a film containing the "impurity which suppresses generation of crystal nuclei;" or 4) to add the "impurity which suppresses generation of crystal nuclei" in a gas used at the early stage of forming the semiconductor film.

It is preferable to use nitrogen or nitride as the above "impurity which suppresses generation of crystal nuclei." In the case of making nitrogen contained in the semiconductor layer, the nitrogen concentration in the semiconductor layer, which is measured by secondary ion mass spectrometry (SIMS), may be $1\times10^{20}$ $cm^{-3}$ to $1\times10^{21}$ $cm^{-3}$. The peak concentration of nitrogen in the vicinity of the interface between a gate insulating layer and the semiconductor layer, which is measured by SIMS, is preferably $3\times10^{20}$ $cm^{-3}$ to $1\times10^{21}$ $cm^{-3}$. The nitrogen concentration is reduced in a thickness direction of the semiconductor layer from the vicinity of the interface between the gate insulating layer and the semiconductor layer, whereby controlling the nucleation positions which are to be growing ends of a crystal grain and the nucleation density.

Note that an impurity element such as nitrogen as described above by which carrier traps are not formed in silicon is selected as an "impurity which suppresses generation of crystal nuclei," for example. In contrast, the concentration of an impurity element (e.g., oxygen) which forms dangling bonds of silicon is reduced. It is preferable that the concentration of oxygen, which is measured by SIMS, be less than or equal to $5\times10^{18}$ $cm^{-3}$.

Note that the "concentration" in this specification is based on a measurement value by SIMS. However, the measurement method is not limited to SIMS when particular description of another measurement method is made.

Note that a "film," in this specification, refers to a film which is formed over the entire surface of an object by a CVD method (including a plasma CVD method and the like), a sputtering method, or the like. On the other hand, a "layer" refers to a layer which is formed by processing a "film" or a layer which is formed over the entire surface of an object and does not require to be subjected to processing. However, a "film" and a "layer" do not have to be particularly distinguished.

According to one embodiment of the present invention, a "layer containing an amorphous phase" is formed between a source region and a drain region; thus, a resistance between the source region and the drain region can be increased, and off current can be reduced. Therefore, a TFT with a high switching property can be fabricated.

DETAILED DESCRIPTION OF THE INVENTION

Figure 1A:
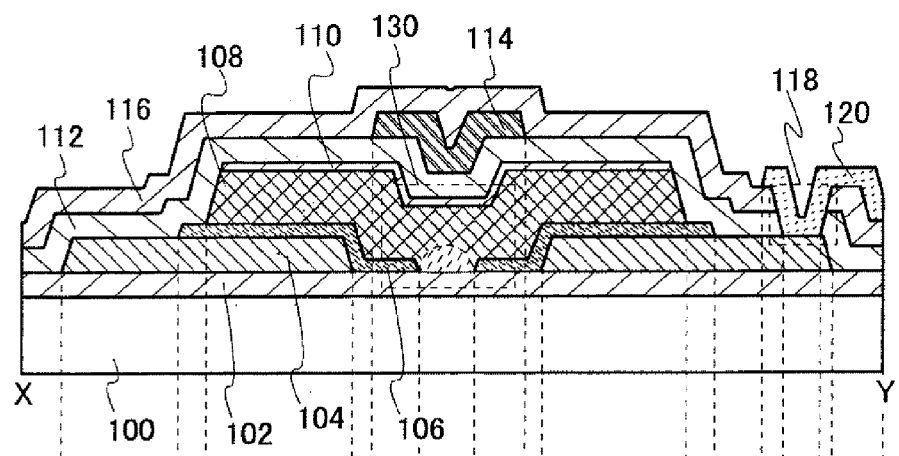
FIGS. 1A and 1B show examples of a cross-sectional view and a top view of a TFT of Embodiment 1.

Embodiments of the present invention are described below with reference to the drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments. Note that some reference numerals which denote the same portions are commonly used in different drawings in describing the structure of the present invention with reference to the drawings.

Note that, in the drawings or the like which are referred to in the description below, the size, the thickness, the width of a region, or the like of each structure is often exaggerated for clarity. Therefore, embodiments of the present invention are not limited to such scales in the drawings or the like.

Note that embodiments described below can be implemented in combination with each other as long as there is no contradiction.

Embodiment 1

In this embodiment, an example of a TFT which is one embodiment of the present invention is described.

Figure 1B:
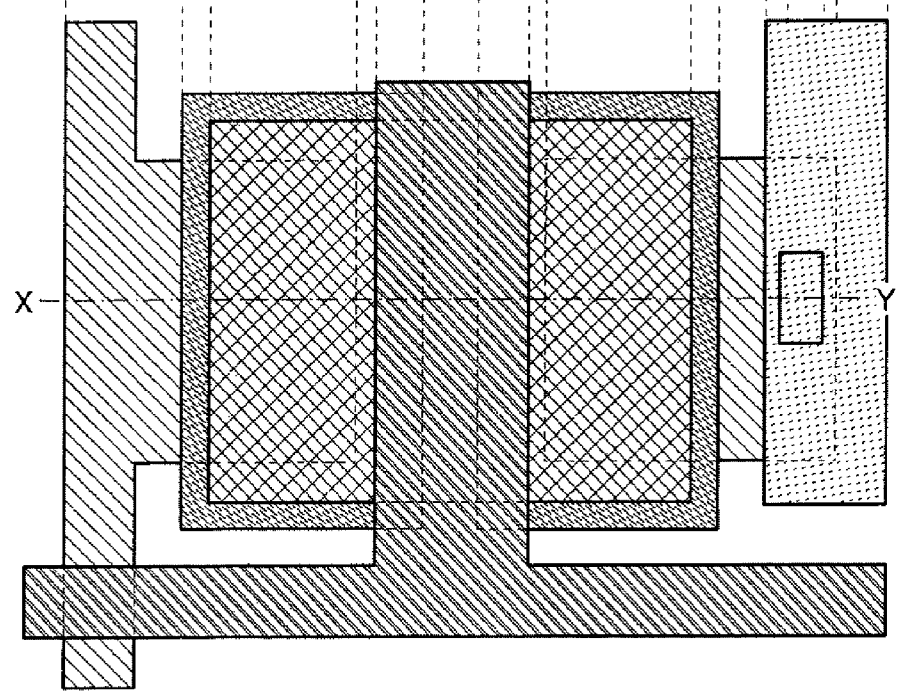

FIG. 1B is a top view of a TFT of this embodiment and FIG. 1A is a cross-sectional view along the line X-Y in the top view.

The TFT shown in FIGS. 1A and 1B includes a base layer 102 over a substrate 100, a first wiring layer 104 over the base layer 102, an impurity semiconductor layer 106 which is in contact with at least part of the first wiring layer 104, a semiconductor layer 108 at least part of which is electrically connected to the first wiring layer 104 through the impurity semiconductor layer 106, a first insulating layer 110 over the semiconductor layer 108, a second insulating layer 112 provided so as to cover at least the semiconductor layer 108 and the first insulating layer 110, and a second wiring layer 114 provided over the second insulating layer 112 and overlapped with at least part of the impurity semiconductor layer 106 and a region between a source region and a drain region formed using the impurity semiconductor layer 106 (including a channel formation region of the semiconductor layer 108). That is, the TFT shown in FIGS. 1A and 1B is a top-gate staggered TFT.

The substrate 100 is an insulating substrate. A glass substrate or a quartz substrate can be used as the substrate 100, for example. Here, a glass substrate is used. When the substrate 100 is a mother glass, the substrate may have any of the sizes from the first generation (e.g., 320 mm×400 mm) to the tenth generation (e.g., 2950 mm×3400 mm); however, the substrate is not limited thereto. In the case where the substrate 100 does not necessarily have a light-transmitting property, a metal substrate, such as a stainless steel alloy substrate, provided with an insulating layer on its surface may be used.

The base layer 102 may be formed using an insulating material (e.g., silicon oxide, silicon nitride, silicon oxynitride, or silicon nitride oxide). The base layer 102 may have a single layer structure or a stacked structure including a plurality of layers. In the case where the substrate 100 contains movable ions such as alkali metal ions (e.g., Na), the base layer 102 is preferably formed using silicon nitride or silicon nitride oxide so that such ions are prevented from entering the semiconductor layer and the like.

Note that "silicon nitride oxide" contains more nitrogen than oxygen and it preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively in the case where measurements are performed using Rutherford backscattering spectrometry (RBS) and hydrogen forward scattering spectrometry (HFS).

In contrast, "silicon oxynitride" contains more oxygen than nitrogen and it preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively in the case where measurements are performed using RBS and HFS.

Note that percentages of nitrogen, oxygen, silicon, and hydrogen fall within the ranges given above when the total number of atoms contained in the silicon oxynitride or the silicon nitride oxide is defined as 100 at. %.

The first wiring layer 104 forms at least a signal line, and a source electrode and a drain electrode. The first wiring layer 104 may be formed using a conductive material (e.g., metal, or a semiconductor to which an impurity element imparting one conductivity type is added). The first wiring layer 104 may have a single layer structure or a stacked structure including a plurality of layers. Here, the first wiring layer 104 is formed to have a stacked structure including three layers in which an Al layer is interposed between Ti layers, for example.

The impurity semiconductor layer 106 forms at least a source region and a drain region, and is formed using a semiconductor in which an impurity element imparting one conductivity type is contained. When the TFT is an n-channel TFT, P or As is given as an impurity element imparting one conductivity type, for example. When the TFT is a p-channel TFT, B is given as an impurity element imparting one conductivity type, for example. Note that it is preferable that the TFT is an n-channel TFT. Therefore, silicon to which P is added is used here. Note that the impurity semiconductor layer 106 is formed using a crystalline semiconductor such as a microcrystalline semiconductor. Impurity elements which serve as donors or acceptors may be added to a source gas at the time of forming an impurity semiconductor film or after forming the semiconductor film.

The semiconductor layer 108 includes a crystalline region and a region containing an amorphous phase. An enlarged view showing a portion 130 in FIG. 1A is shown in FIG. 5.

Figure 5:
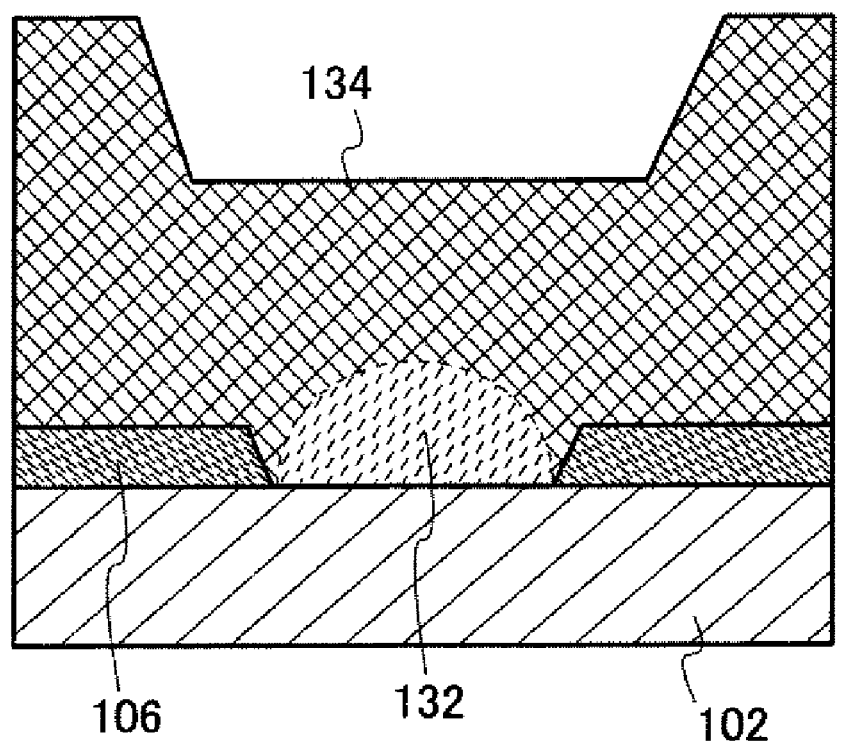
FIG. 5 illustrates a semiconductor layer included in a TFT of Embodiment 1.

As shown in FIG. 5, a region containing an amorphous phase 132 in the semiconductor layer 108 is formed between the two impurity semiconductor layers 106 provided with a space to each other, and a crystalline region 134 is formed above the region containing an amorphous phase 132.

In the structure as shown in FIG. 5, a semiconductor film may be formed according to the conditions under which crystal nuclei of a crystalline semiconductor film (e.g., a microcrystalline semiconductor film) are produced and the crystal nuclei are grown when an "impurity which suppresses generation of crystal nuclei" is provided on at least a surface of the base layer 102, for example. Typically, nitrogen can be given as the "impurity which suppresses generation of crystal nuclei." Since the impurity semiconductor layers 106 are formed using a crystalline semiconductor, a crystal grows from a region in contact with the impurity semiconductor layers 106, and a crystalline region in the semiconductor layer 108 is formed.

Note that, when the above "impurity which suppresses generation of crystal nuclei" is present at a high concentration (a concentration measured by secondary ion mass spectrometry is around $1 \times 10^{20}$ cm$^{-3}$ or more), crystal growth is also suppressed.

The region containing an amorphous phase 132 in the semiconductor layer 108 contains an amorphous structure and includes minute crystal grains. Further, the region containing an amorphous phase 132 in the semiconductor layer 108 has lower energy at an urbach edge measured by constant photocurrent method (CPM) or photoluminescence spectroscopy and has a small number of absorption spectra of defects, as compared to a conventional amorphous semiconductor layer. Accordingly, it can be said that the region containing an amorphous phase 132 in the semiconductor layer 108 is a semiconductor layer having a high level of orderliness in which the number of defects is small and a tail slope of a level at a band edge of a valence band is steep, as compared to a conventional amorphous semiconductor layer. A peak region of spectrum of the region containing an amorphous phase 132 in the semiconductor layer 108, which is measured by low temperature photoluminescence spectroscopy, is greater than or equal to 1.31 eV and less than or equal to 1.39 eV. Note that a peak region of spectrum of the microcrystalline semiconductor layer, typically a microcrystalline silicon layer, which is measured by low temperature photoluminescence spectroscopy, is greater than or equal to 0.98 eV and less than or equal to 1.02 eV.

Note that the region containing an amorphous phase 132 may be formed using an amorphous semiconductor in which minute crystal grains are not contained.

Note that an NH group or an NH$_2$ group can be used instead of nitrogen as the "impurity which suppresses generation of crystal nuclei." When the semiconductor layer 108 contains an NH group, dangling bonds can be cross-linked. When the semiconductor layer 108 contains an NH$_2$ group, dangling bonds can be terminated. Accordingly, an NH group or an NH$_2$ group contributes to increase in on current. Note that an NH$_3$ gas may be contained in a gas used for forming the semiconductor layer 108 so that an NH group or an NH$_2$ group is contained in the semiconductor layer 108.

Note that the nitrogen concentration in the semiconductor layer 108 gradually decreases as a distance from the interface between the semiconductor layer 108 and the base layer increases. The nitrogen concentration is preferably decreased by one digit as compared with that of the base layer in the range of greater than or equal to 25 nm and less than or equal to 40 nm, more preferably decreased by one digit in the range of greater than or equal to 30 nm and less than or equal to 35 nm.

As described above, the semiconductor layer 108 with a top gate structure has the structure shown in FIG. 5; thus, crystallinity in a channel formation region can be improved. Therefore, in the TFT, the field-effect mobility can be improved and thus on current can be increased.

Furthermore, a "layer containing an amorphous phase" is formed between the source region and the drain region; thus, a resistance between the source region and the drain region can be increased, and off current can be reduced.

Note that a crystal region, a region containing an amorphous phase, and the like are generally referred to as a "semiconductor layer" in a view showing the TFT of the specification.

The first insulating layer 110 functions not only at least as part of the gate insulating layer of the TFT, but also functions as a protective layer for the semiconductor layer 108. The first insulating layer 110 may be formed using an insulating material (e.g., silicon nitride, silicon nitride oxide, silicon oxynitride, or silicon oxide). Alternatively, the first insulating layer 110 may be formed using amorphous silicon. The first insulating layer 110 may have a single layer structure or a stacked structure including a plurality of layers. In this embodiment, the first insulating layer 110 is formed to have a stacked structure including two layers in which a silicon oxynitride layer is stacked over a silicon nitride layer, for example. It is preferable that the first insulating layer 110 be formed using silicon oxide or silicon oxynitride.

The second insulating layer 112 functions at least as a part of the gate insulating layer of the TFT. The second insulating layer 112 may be formed using a material similar to that of the first insulating layer 110; preferably, the second insulating layer 112 is formed using silicon nitride or silicon nitride oxide.

Note that it is preferable that the first insulating layer 110 and the second insulating layer 112 be formed using a microwave plasma CVD apparatus with a high frequency (about 1 GHz). When the first insulating layer 110 and the second insulating layer 112 are formed with high frequency plasma using a microwave plasma CVD apparatus, the dielectric strength voltage between a gate, and a drain and a source can be improved; therefore, a highly reliable TFT can be obtained.

The second wiring layer 114 forms at least a scanning line and a gate electrode. The second wiring layer 114 may be formed using a conductive material (e.g., metal, or a semiconductor to which an impurity element imparting one conductivity type is added) like the first wiring layer 104. Note that the second wiring layer 114 may have a single layer structure or a stacked structure including a plurality of layers. Here, the second wiring layer 114 is formed to have a stacked structure including three layers in which an Al layer is interposed between Ti layers, for example.

A third insulating layer 116 functions at least as a protective layer (a so-called passivation layer) of the TFT and prevents impurities which may be contamination sources such as an organic substance, metal, or water vapor floating in the air from entering the TFT. The third insulating layer 116 may be formed using an insulating material (e.g., silicon nitride, silicon nitride oxide, silicon oxynitride, or silicon oxide). Note that the third insulating layer 116 may be formed to have a single layer structure or a stacked structure including a plurality of layers; preferably, the third insulating layer 116 is formed using silicon nitride or silicon nitride oxide.

A third wiring layer 120 forms at least a pixel electrode. The third wiring layer 120 can be formed using a conductive composition containing a conductive high molecule (also referred to as a conductive polymer) having a light-transmitting property. The third wiring layer 120 preferably has a sheet resistance of less than or equal to 10000 Ω/cm$^2$ and has a light transmittance of greater than or equal to 70% at a wavelength of 550 nm. Further, the resistivity of the conductive high molecule contained in the conductive composition is preferably less than or equal to 0.1 Ω·cm. As the conductive high molecule, a so-called π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Alternatively, the third wiring layer 120 can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, ITO to which silicon oxide is added, or the like.

Here, a method for fabricating the TFT illustrated in FIGS. 1A and 1B is described.

Figure 2A:
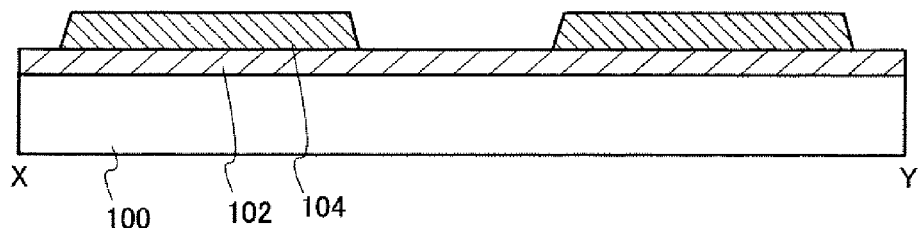
FIGS. 2A to 2D show one example of a fabrication method of a TFT of Embodiment 1.

First, the base layer 102 is formed over the substrate 100. After that, the first wiring layer 104 is formed in such a manner that a first conductive film is formed over the base layer 102 and the first conductive film is processed by a photolithography method (FIG. 2A).

Figure 2B:
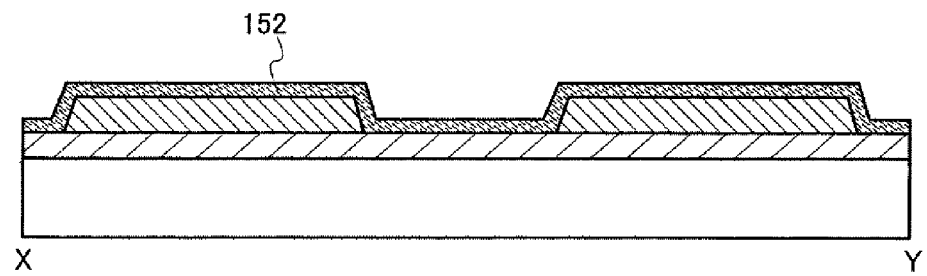
Figure 2C:
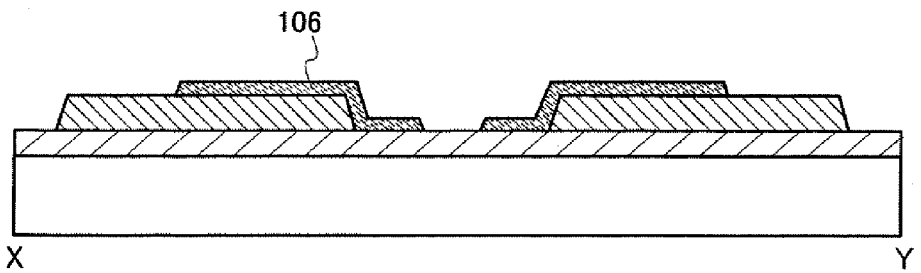

Next, an impurity semiconductor film 152 is formed in contact with the first wiring layer 104 (FIG. 2B). The impurity semiconductor film 152 is processed into the impurity semiconductor layer 106 by a photolithography method (FIG. 2C).

Figure 2D:
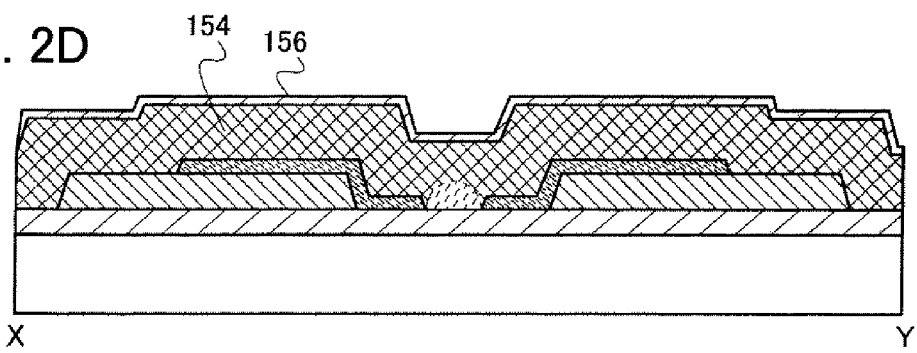

Next, a semiconductor film 154 which is in contact with at least the impurity semiconductor layer 106 and a first insulating film 156 are stacked in this order (FIG. 2D). The semiconductor film 154 is formed according to the conditions under which crystal nuclei of a crystalline semiconductor film (e.g., a microcrystalline semiconductor film) are produced and the crystal nuclei are grown. Since the semiconductor film 154 is thus formed, crystals are grown from a portion which is in contact with the impurity semiconductor layer 106.

The semiconductor film 154 is a film which is to be processed into the semiconductor layer 108. Consequently, a region containing an amorphous phase is formed at a portion which is in contact with the base layer 102, and a crystalline region is formed in a portion where the concentration of the "impurity which suppresses generation of crystal nuclei" is sufficiently reduced.

The condition in which the "impurity which suppresses generation of crystal nuclei" is present can be made by the following methods, for example: 1) to make the "impurity which suppresses generation of crystal nuclei" present on a surface where the semiconductor film is to be formed; 2) to add the "impurity which suppresses generation of crystal nuclei" in a film which has a surface over which the semiconductor film is to be formed; 3) to cover an inner wall of a reaction chamber used for forming the semiconductor film with a film containing the "impurity which suppresses generation of crystal nuclei;" or 4) to add the "impurity which suppresses generation of crystal nuclei" in an gas used at the early stage of forming the semiconductor film.

It is preferable to use nitrogen or nitride as the above "impurity which suppresses generation of crystal nuclei." In the case of making nitrogen contained in the semiconductor layer, the nitrogen concentration in the semiconductor layer, which is measured by secondary ion mass spectrometry (SIMS), may be $1\times10^{20}$ cm$^{-3}$ to $1\times10^{21}$ cm$^{-3}$. The peak concentration of nitrogen in the vicinity of the interface between the gate insulating layer and the semiconductor layer, which is measured by SIMS, is preferably $3\times10^{20}$ cm$^{-3}$ to $1\times10^{21}$ cm$^{-3}$. The nitrogen concentration is reduced in a thickness direction of the semiconductor layer from the vicinity of the interface between the gate insulating layer and the semiconductor layer, whereby controlling the nucleation positions which are to be growing ends of a crystal grain and the nucleation density.

Note that an impurity element such as nitrogen as described above by which carrier traps are not formed in silicon is selected as the "impurity which suppresses generation of crystal nuclei," for example. In contrast, the concentration of an impurity element (e.g., oxygen) which produces dangling bonds of silicon is reduced. It is preferable that the concentration of oxygen, which is measured by SIMS, be less than or equal to $5\times10^{18}$ cm$^{-3}$.

Here, a silicon nitride layer may be used for the base layer 102, for example.

Figure 3A:
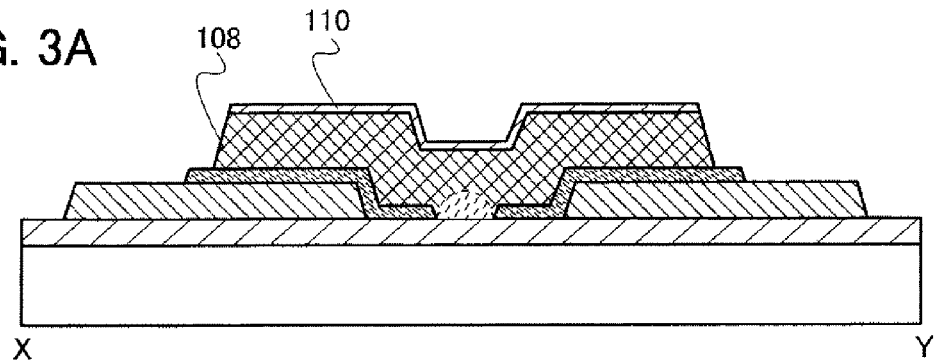
FIGS. 3A to 3D show one example of a fabrication method of a TFT of Embodiment 1.

Next, the semiconductor film 154 and the first insulating film 156 are processed by a photolithography method, and the semiconductor layer 108 and the first insulating layer 110 are formed (FIG. 3A).

Note that the first insulating film 156 is provided in order to prevent the semiconductor film 154 from being polluted in the process performed by the above photolithography method.

Figure 3B:
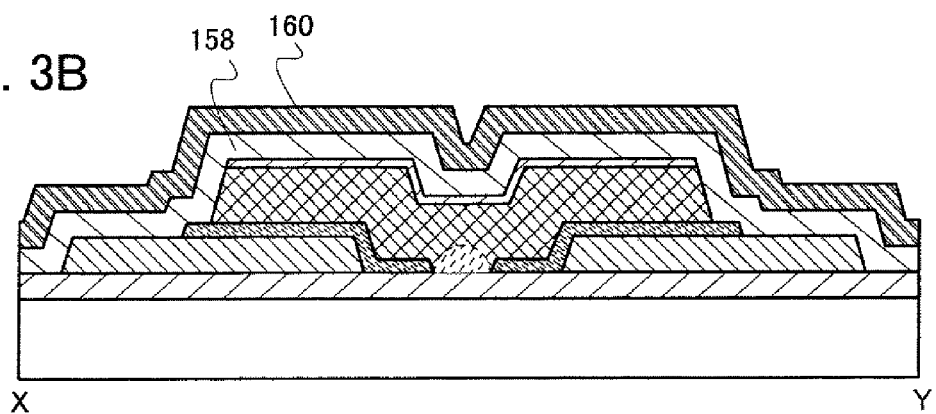

Next, a second insulating film 158 is formed covering at least the semiconductor layer 108 and the first insulating layer 110, and a second conductive film 160 is formed over the second insulating film 158 (FIG. 3B).

Figure 3C:
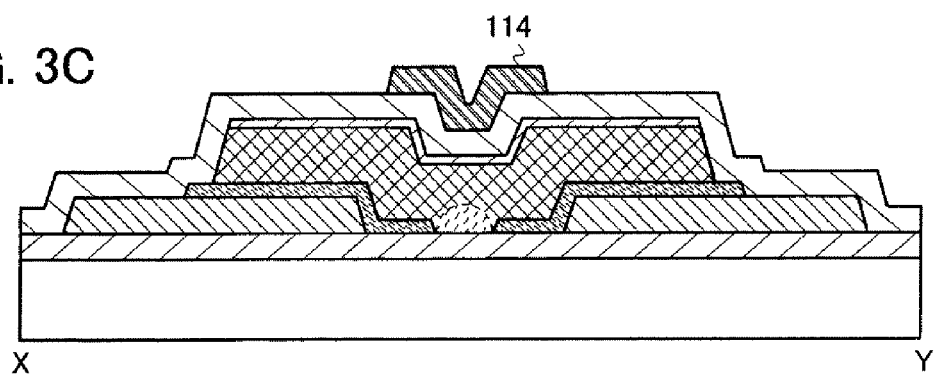

Next, the second conductive film 160 is processed by a photolithography method into the second wiring layer 114 (FIG. 3C).

A TFT can be fabricated in the above described manner.

Figure 3D:
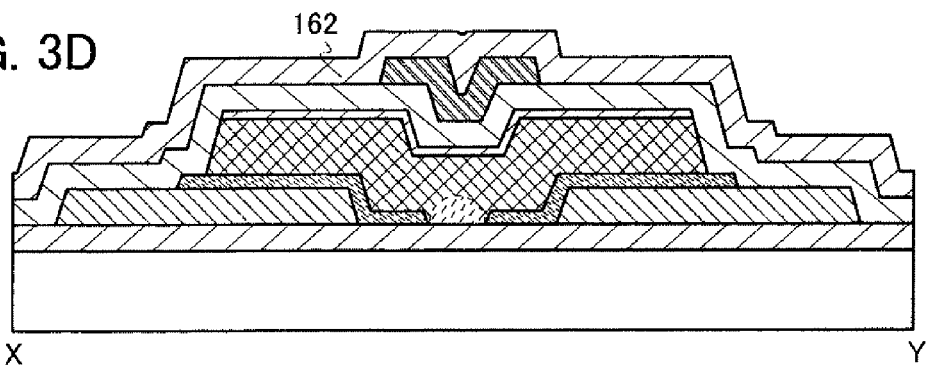

Next, a third insulating film 162 is formed covering at least the second wiring layer 114 (FIG. 3D).

Figure 4A:
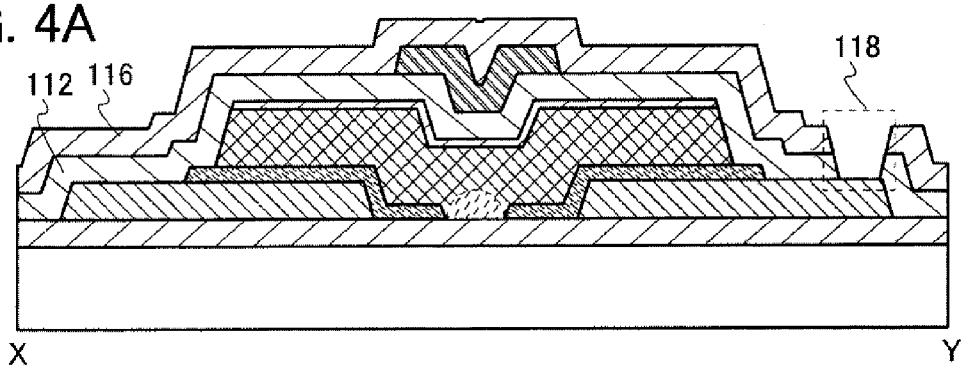
FIGS. 4A and 4B show one example of a fabrication method of a TFT of Embodiment 1.

Next, the second insulating film 158 and the third insulating film 162 are processed by a photolithography method into the second insulating layer 112 and the third insulating layer 116 which are provided with an opening 118 (FIG. 4A).

Figure 4B:
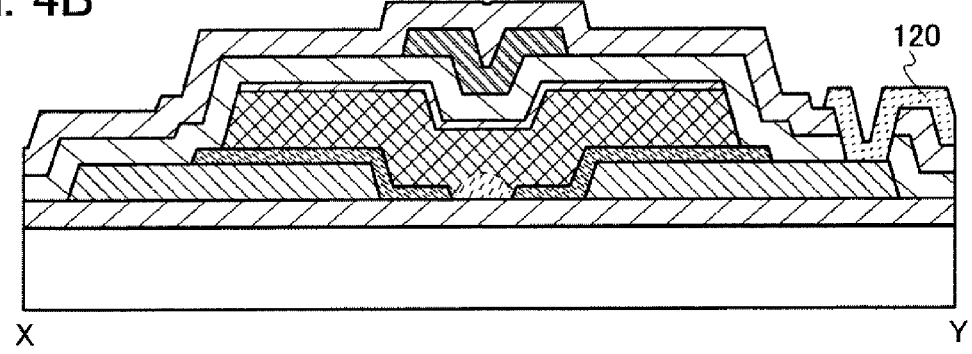

Next, a third conductive film is formed so as to be electrically connected to the first wiring layer 104 through the opening 118, and the third conductive film is processed by a photolithography method into the third wiring layer 120 (FIG. 4B).

In the above-described manner, the pixel TFT (pixel transistor) shown in FIGS. 1A and 1B can be fabricated.

The TFT described in this embodiment has high field effect mobility and a large amount of on current. In addition, off current can be sufficiently suppressed. Consequently, according to a manner described in this embodiment, a TFT with a high on-off ratio can be obtained.

Embodiment 2

In this embodiment, an embodiment of the present invention which is different from Embodiment 1 is described. Specifically, a first conductive film and an impurity semiconductor film are stacked, and processed with one photomask.

Note that the same portions as that in Embodiment 1 are denoted by the same reference numerals.

Figure 6A:
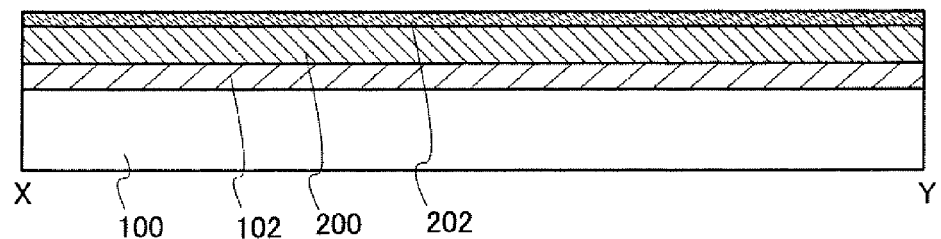
FIGS. 6A to 6D show one example of a fabrication method of a TFT of Embodiment 2.

A base layer 102 is formed over a substrate 100, a first conductive film 200 is formed over the base layer 102, and an impurity semiconductor film 202 is formed over the first conductive film 200 (FIG. 6A).

The first conductive film 200 can be formed in the same manner as that of the first conductive film in Embodiment 1. Note that the first conductive film 200 is a film to be a first wiring layer 204 here.

The impurity semiconductor film 202 can be formed using a similar material and in a similar manner to those of the first impurity semiconductor film 152 in Embodiment 1.

Figure 6B:
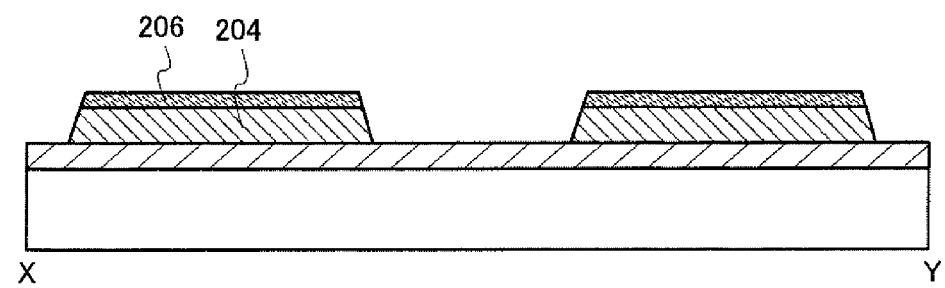

Next, the first conductive film 200 and the impurity semiconductor film 202 are processed by a photolithography method into the first wiring layer 204 and an impurity semiconductor layer 206 (FIG. 6B). Since the first wiring layer 204 and the impurity semiconductor layer 206 are formed in such a manner, their side surfaces are in the same plane. Note that when etching progresses on either of the first conductive film 200 and the impurity semiconductor film 202 faster than the other film due to chemical reaction or the like, their side surfaces are not necessarily in the same plane.

Figure 6C:
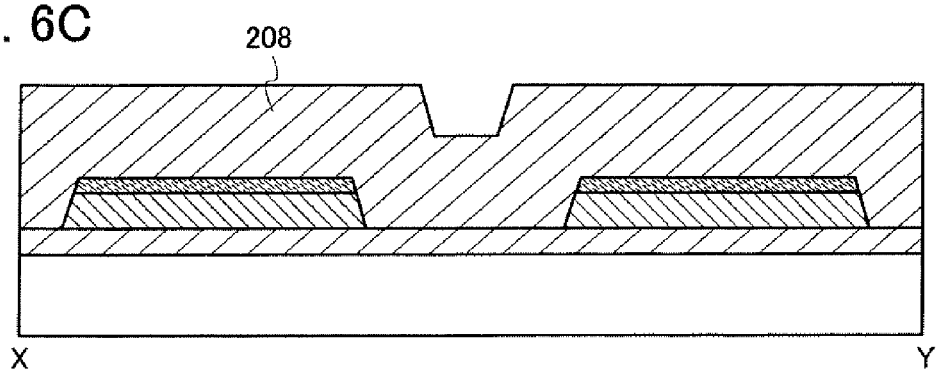
Figure 6D:
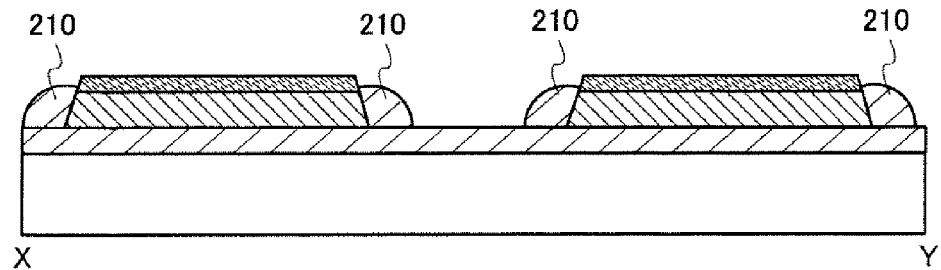

Next, an insulating film 208 is formed covering the impurity semiconductor layer 206 and the like (FIG. 6C). The insulating film 208 is etched; thus, side wall insulating layers 210 are formed (FIG. 6D). As the etching mentioned here, a highly anisotropic dry etching may be performed in a direction perpendicular to the substrate 100; for example, a dry etching using a gas containing a rare gas may be performed.

Figure 7A:
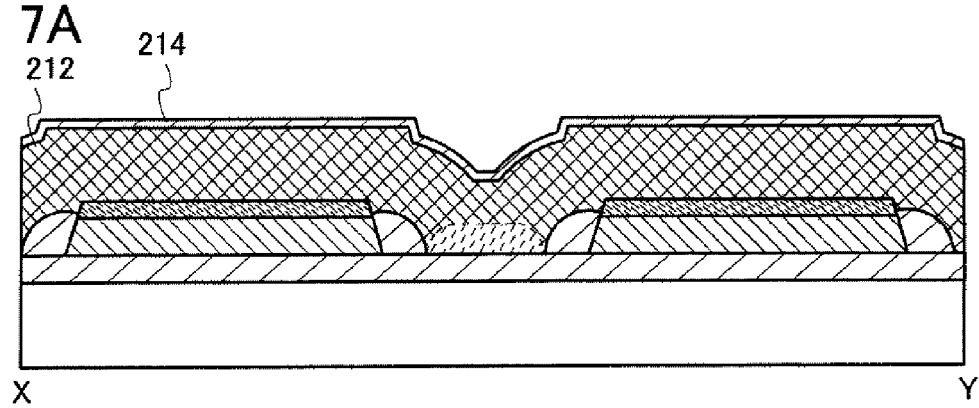
FIGS. 7A and 7B show one example of a fabrication method of a TFT of Embodiment 2.

Next, a semiconductor film 212 which is in contact with at least part of the impurity semiconductor layer 206 and a first insulating film 214 are stacked in this order (FIG. 7A).

The semiconductor film 212 can be formed using a similar material and in a similar manner to those of the semiconductor film 154 in Embodiment 1. The first insulating film 214 can be formed using a similar material and in a similar manner to those of the first insulating film 156 in Embodiment 1.

Next, the semiconductor film 212 and the first insulating film 214 are processed into a semiconductor layer 216 and a first insulating layer 218. The subsequent steps are similar to the fabrication method described in Embodiment 1.

Figure 7B:
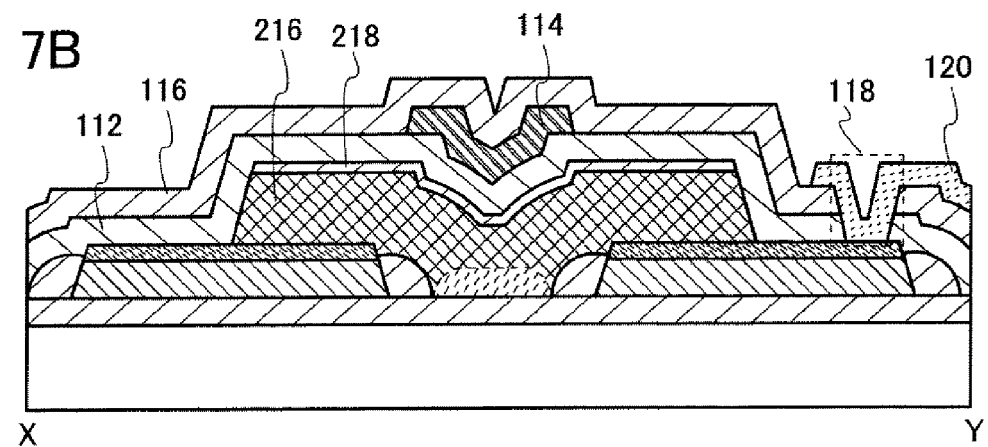

In the above manner, the TFT of this embodiment can be fabricated (FIG. 7B).

Note that the side wall insulating layer 210 may be formed between the first wiring layer 204 and the semiconductor layer 216.

According to this embodiment, the first wiring layer and the impurity semiconductor layer can be formed using one photomask. Consequently, a TFT can be fabricated using a small number of masks.

Note that the TFT of this embodiment is not limited to the above description, and the side wall insulating layer 210 can not be provided. However, in the above described structure, the semiconductor layer 216 and the first wiring layer 204 are not in direct contact with each other. Therefore, off current flowing through a side in the semiconductor layer 216 which is close to the substrate 100 between the source and the drain formed using the first wiring layer 204 can be suppressed. Consequently, the TFT of this embodiment can have a high on/off ratio.

Embodiment 3

In this embodiment, an embodiment of the present invention which is different from Embodiment 1 and Embodiment 2 is described. Specifically, an embodiment in which a third insulating layer is not provided between a second wiring layer and a third wiring layer is described.

Figure 8A:
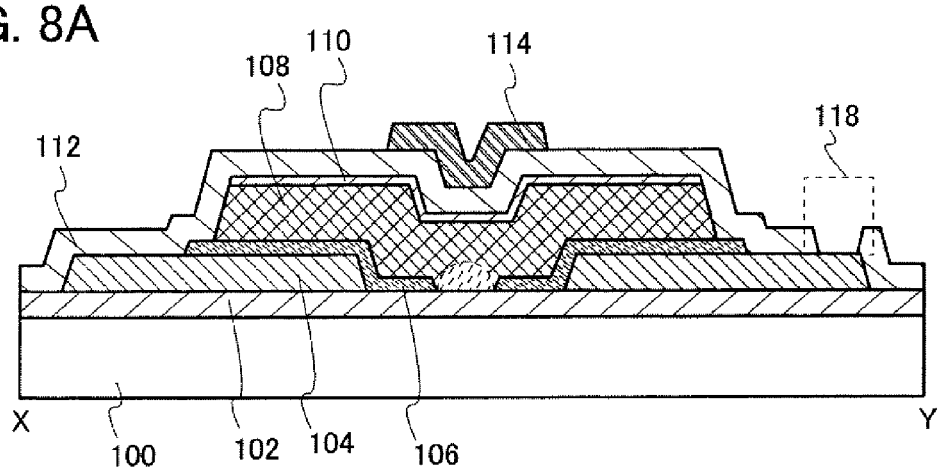
FIGS. 8A to 8C show one example of a fabrication method of a TFT of Embodiment 3.

First, steps up to the formation of the second wiring layer 114 are performed and the structure illustrated in FIG. 3C is obtained, and the opening 118 is formed in the second insulating film 158 so that the second insulating layer 112 is formed (FIG. 8A).

Figure 8B:
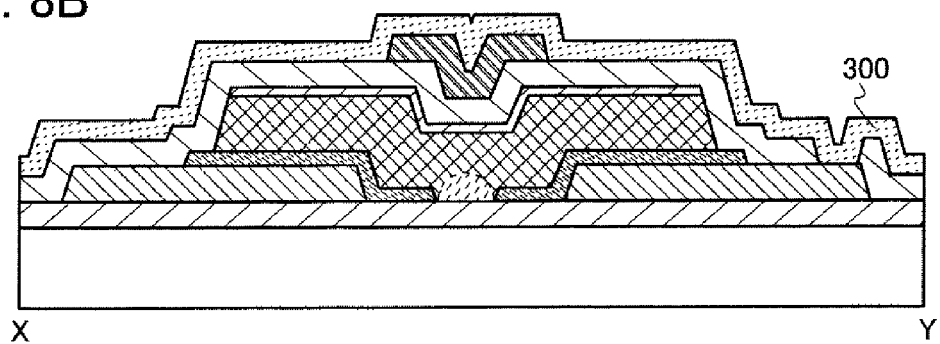

Next, a third conductive film 300 is formed over the second insulating layer 112 in contact with the first wiring layer 104 through the opening 118 (FIG. 8B). At this time, the second wiring layer 114 and the third conductive film 300 are formed in contact with each other.

Figure 8C:
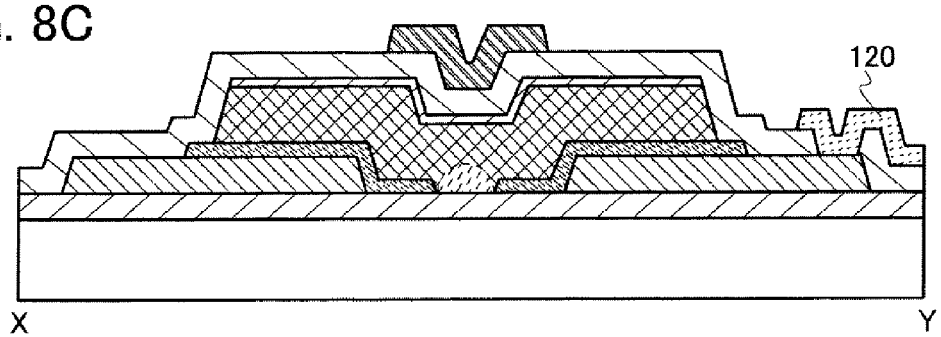

Next, the third conductive film 300 is processed into a third wiring layer 120. In such a manner, a TFT of this embodiment can be fabricated (FIG. 8C).

Following the above process, the second wiring layer 114 and the third conductive film 300 might be in contact with each other. When the second wiring layer 114 and the third conductive film 300 are formed using different kinds of metals, electrochemical corrosion might occur. For example, when the second wiring layer 114 is formed using Al and the third conductive film 300 is formed using ITO, electrochemical corrosion occurs frequently.

Note that "electrochemical corrosion" refers to a phenomenon in which one kind of the metals is corroded when different kinds of metals (metals with different ionization tendencies) are in contact with each other.

Therefore, when the second wiring layer 114 is formed using Al, a stacked structure in which an Al layer is interposed between layers of Ti, Mo, or the like may be applied. Furthermore, it is preferable that the property of the second wiring layer 114 is improved by performing a nitrogen plasma treatment on the surface of the second wiring layer 114 which is not covered, before the third conductive film 300 is formed, for example. Still preferably, the plasma treatment is performed before the opening 118 is formed.

Alternatively, as the second wiring layer 114, an Al—Ni—La alloy obtained by adding Ni and La into Al may be used. When the Al—Ni—La alloy is used, contact resistance is difficult to be increased between the alloy and ITO. Here, an Al—Ni—La alloy in which 1.0 atomic % to 4.0 atomic % of Ni and 0.35 atomic % of La are added is preferably used. Note that the Al—Ni—La alloy is not limited to a material for the second wiring layer 114 of this embodiment, and can be used for materials of various wiring layers in this embodiment and the other embodiments.

According to this embodiment, a pixel TFT can be fabricated without providing the third insulating layer between the second wiring layer and the third wiring layer. According to this embodiment, the fabrication cost can be reduced because the third insulating layer 116 does not have to be formed.

Embodiment 4

In this embodiment, an embodiment of the present invention which is different from Embodiment 1 to Embodiment 3 is described. Specifically, an embodiment in which a light blocking layer is provided between the substrate and the TFT is described. The light blocking layer is provided between the substrate and the TFT, whereby an effect due to optical current can be suppressed.

Figure 9A:
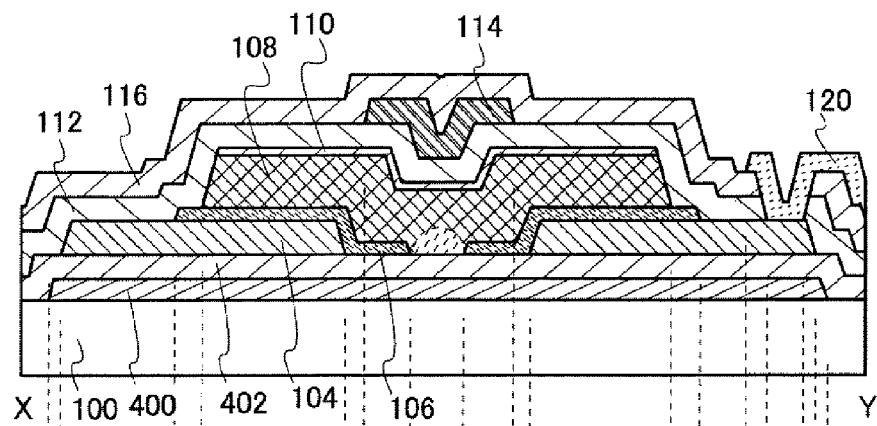
FIGS. 9A and 9B show examples of a cross-sectional view and a top view of a TFT of Embodiment 4.
Figure 9B:
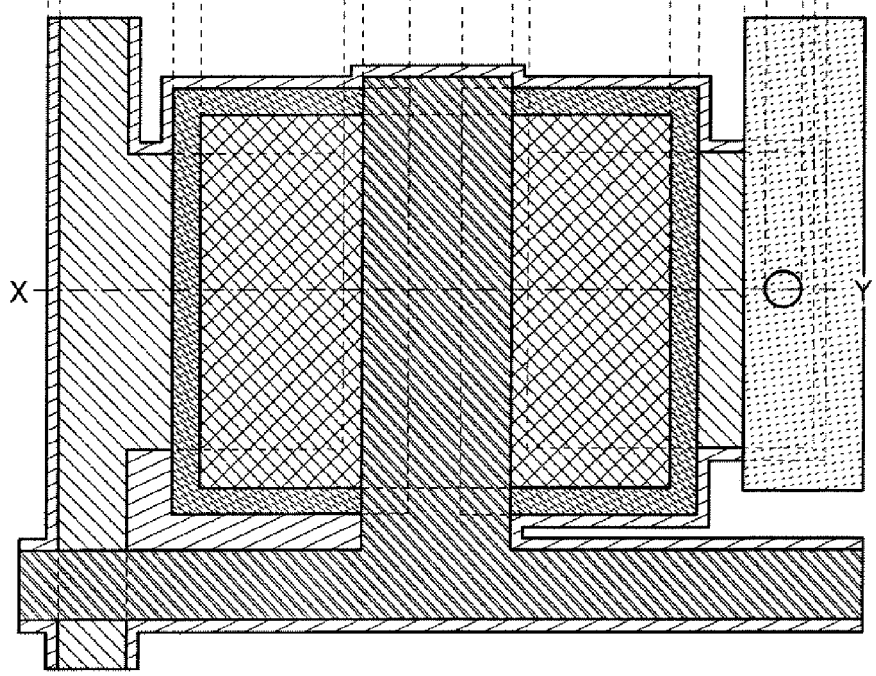

A pixel TFT in this embodiment is shown in FIGS. 9A and 9B. That is, the pixel TFT shown in FIGS. 9A and 9B includes a light blocking layer 400 provided over a substrate 100 and overlapped with the entire surface of the TFT, a base layer 402 provided covering the light blocking layer 400, a first wiring layer 104 over the base layer 402, an impurity semiconductor layer 106 at least part of which is in contact with the first wiring layer 104, a semiconductor layer 108 at least part of which is electrically connected to the first wiring layer 104 through the impurity semiconductor layer 106, a first insulating layer 110 over the semiconductor layer 108, a second insulating layer 112 provided covering at least the semiconductor layer 108 and the first insulating layer 110, a second wiring layer 114 provided over the second insulating layer 112 and overlapped with at least part of the impurity semiconductor layer 106 and a region between the source region and the drain region formed using the impurity semiconductor layer 106 (including the channel formation region of the semiconductor layer 108), a third insulating layer 116 provided covering at least the second wiring layer 114, and a third wiring layer 120 provided over the third insulating layer 116 and electrically connected to the first wiring layer 104.

The light blocking layer 400 may be formed in such a manner that a material film to be a light blocking layer is formed over the substrate 100 by a sputtering method or the like, and this film is processed by a photolithography method. That is, one more photomask is needed when the light blocking layer 400 is provided. As a material film to be a light blocking layer, a material film containing Cr as its main component (including a Cr nitride film, a Cr oxide film) can be used, for example.

Note that the base layer 402 may be formed using a similar material and in a similar manner to those of the base layer 102 in Embodiment 1.

Note that although the light blocking layer 400 is provided so as to overlap with the entire surface of the TFT in FIGS. 9A and 9B, the structure is not limited to this. The light blocking layer 400 may be formed so as to shield at least the semiconductor layer 108 from light.

Note that the light blocking layer 400 is provided over and in contact with the substrate 100 in FIG. 9A; however, the structure is not limited to this. Another base film may be provided between the substrate 100 and the light blocking layer 400. When another base film is formed between the substrate 100 and the light blocking layer 400, it can be prevented that the substrate 100 is also etched by a process (e.g., a dry etching) performed for formation of the light blocking layer 400.

Embodiment 5

In this embodiment, an embodiment of the present invention which is different from Embodiment 1 to Embodiment 4 is described. Specifically, six photomasks are needed in a fabrication process of the pixel TFT in Embodiment 1; however, a pixel TFT in this embodiment can be fabricated with three photomasks. Furthermore, a TFT in this embodiment can be fabricated with two photomasks.

Figure 10A:
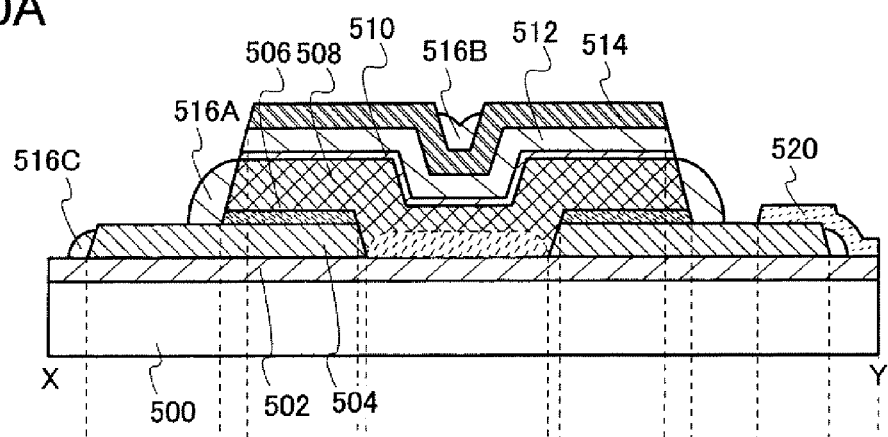
FIGS. 10A and 10B show examples of a cross-sectional view and a top view of a TFT of Embodiment 5.
Figure 10B:
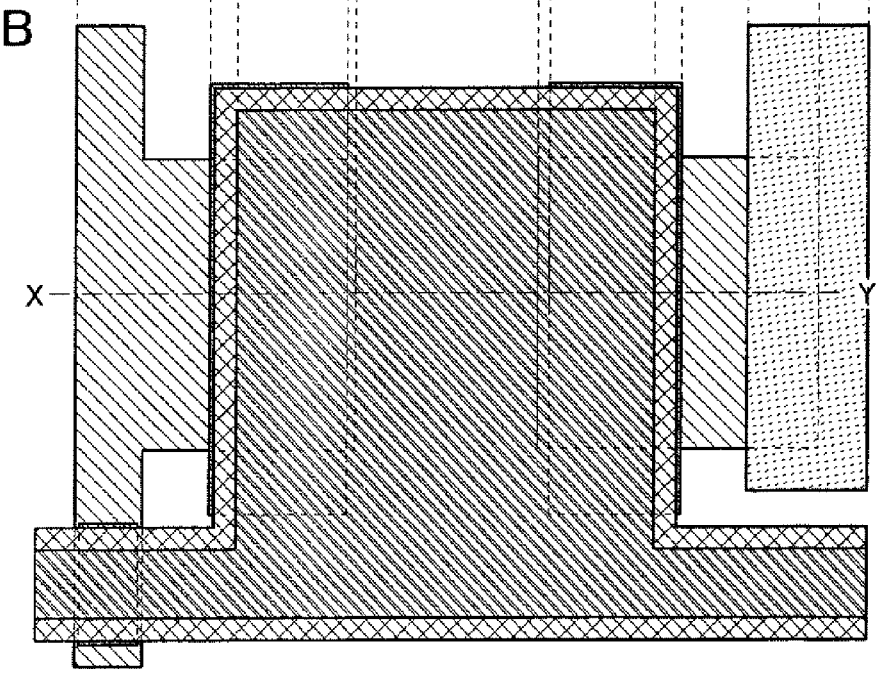

FIG. 10B shows a top view of the pixel TFT of this embodiment, and FIG. 10A shows a cross-sectional view along the line X-Y in the top view.

The pixel TFT shown in FIGS. 10A and 10B includes a base layer 502 over a substrate 500, a first wiring layer 504 over the base layer 502, an impurity semiconductor layer 506 provided over part of the first wiring layer 504, a semiconductor layer 508 at least part of which is electrically connected to the first wiring layer 504 through the impurity semiconductor layer 506, a first insulating layer 510 over the semiconductor layer 508, a second insulating layer 512 over the first insulating layer 510, a second wiring layer 514 provided over the second insulating layer 512 and overlapped with at least part of the impurity semiconductor layer 506 and a region between the source region and the drain region formed using the impurity semiconductor layer 506 (including the channel formation region of the semiconductor layer 508), a side wall insulating layer 516A provided covering at least the side of the semiconductor layer 508, and a third wiring layer 520 electrically connected to the first wiring layer 504. That is, the pixel TFT shown in FIGS. 10A and 10B is a top-gate staggered TFT that is similar to the TFT of Embodiment 1 shown in FIGS. 1A and 1B.

Note that, in the TFT shown in FIGS. 10A and 10B, a side wall insulating layer 516B is formed in a depression of the second wiring layer 514, and a side wall insulating layer 516C is formed in contact with at least the side of the first wiring layer 504. Note that the depression of the second wiring layer 514 is formed due to the thickness of the first wiring layer 504 and the impurity semiconductor layer 506. By forming the side wall insulating layer 516B and the side wall insulating layer 516C, the coverage of the first wiring layer 504 and the second wiring layer 514 with a thin film to be formed thereover can be improved, so that disconnection of a wiring can be prevented for example. The side wall insulating layer 516B and the side wall insulating layer 516C are formed at the same time as the side wall insulating layer 516A.

Note that the side wall insulating layer 516A, the side wall insulating layer 516B, and the side wall insulating layer 516C are not necessarily provided.

Note that both of the first insulating layer 510 and the second insulating layer 512 are not necessarily provided; the second insulating layer 512 may only be provided.

As the substrate 500, a substrate similar to the substrate 100 in Embodiment 1 may be used.

The base layer 502 may be formed using a similar material and in a similar manner to those of the base layer 102 in Embodiment 1.

The first wiring layer 504 may be formed using a similar material and in a similar manner to those of the first wiring layer 104 in Embodiment 1.

The impurity semiconductor layer 506 may be formed using a similar material and in a similar manner to those of the impurity semiconductor layer 106 in Embodiment 1.

The semiconductor layer 508 may be formed using a similar material and in a similar manner to those of the semiconductor layer 108 in Embodiment 1.

The first insulating layer 510 may be formed using a material similar to that of the first insulating layer 110 in Embodiment 1.

The second insulating layer 512 may be formed using a material similar to that of the second insulating layer 112 in Embodiment 1.

The second wiring layer 514 may be formed using a material similar to that of the second wiring layer 114 in Embodiment 1.

The side wall insulating layer 516A may be formed using a material similar to that of the side wall insulating layer 210 in Embodiment 2.

The third wiring layer 520 may be formed using a material similar to that of the third wiring layer 120 in Embodiment 1.

Here, the fabrication method of the TFT shown in FIGS. 10A and 10B is described below.

Figure 11A:
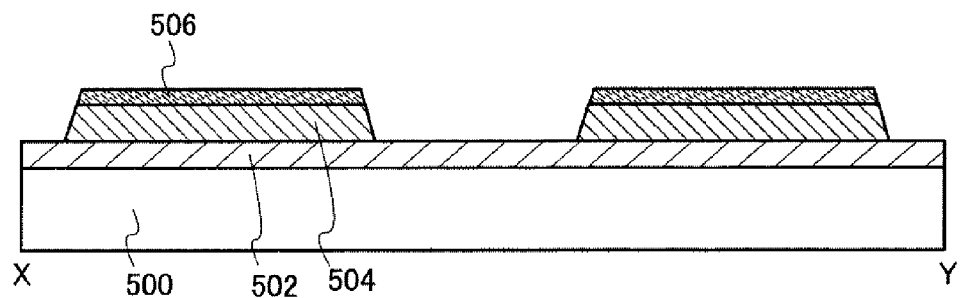
FIGS. 11A to 11D show one example of a fabrication method of a TFT of Embodiment 5.

First, the base layer 502 is formed over the substrate 500. After that, the first wiring layer 504 and the impurity semiconductor layer 506 are formed in such a manner that a first conductive film is formed over the base layer 502, an impurity semiconductor film is formed over the first conductive film, and the first conductive film and the impurity semiconductor film are processed by a photolithography method (FIG. 11A). That is, the fabrication method similar to that in Embodiment 2 can be used. In this step, a first photomask is used.

Figure 11B:
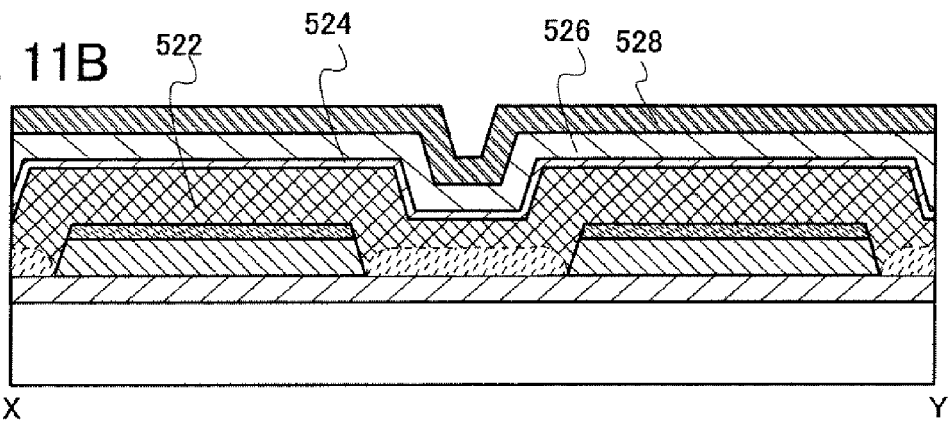

Next, a semiconductor film 522, a first insulating film 524, a second insulating film 526, and a second conductive film 528 are stacked in this order over the impurity semiconductor layer 506 (FIG. 11B).

Figure 11C:
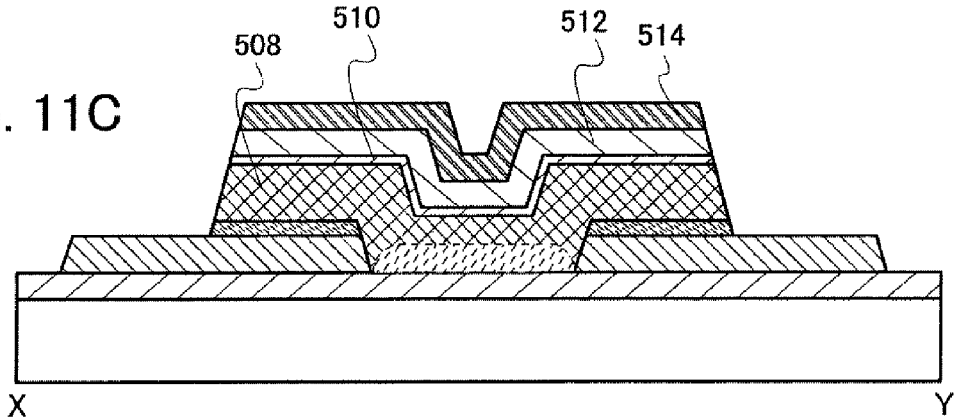

Next, the semiconductor film 522, the first insulating film 524, the second insulating film 526, and the second conductive film 528 are processed by a photolithography method into the semiconductor layer 508, the first insulating layer 510, the second insulating layer 512, and the second wiring layer 514 (FIG. 11C). In this step, a second photomask is used.

As described above, the TFT of this embodiment can be fabricated.

Figure 11D:
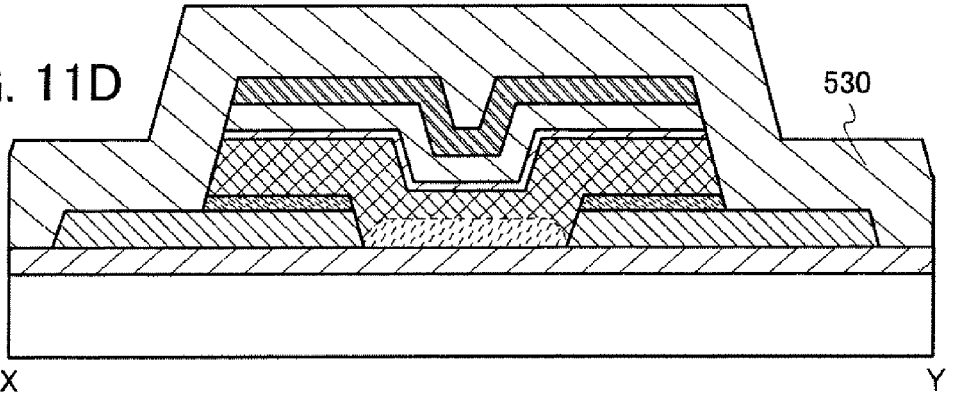

Next, an insulating film 530 is formed covering the TFT fabricated above (FIG. 11D).

Figure 12A:
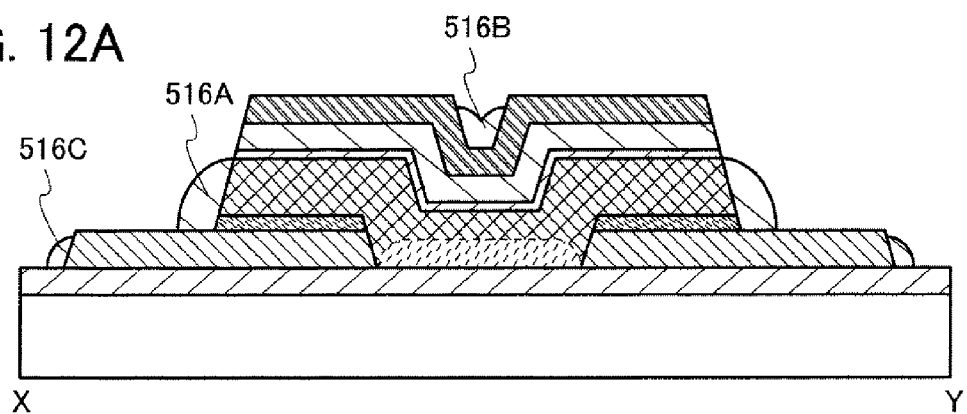
FIGS. 12A to 12C show one example of a fabrication method of a TFT of Embodiment 5.

Next, the side wall insulating layer 516A, the side wall insulating layer 516B, and the side wall insulating layer 516C are formed by etching the insulating film 530 (FIG. 12A). Here, as the etching, a highly anisotropic dry etching is performed in a direction perpendicular to the substrate 500 in a manner similar to that in Embodiment 2. For example, a dry etching may be performed using a gas containing a rare gas.

Figure 12B:
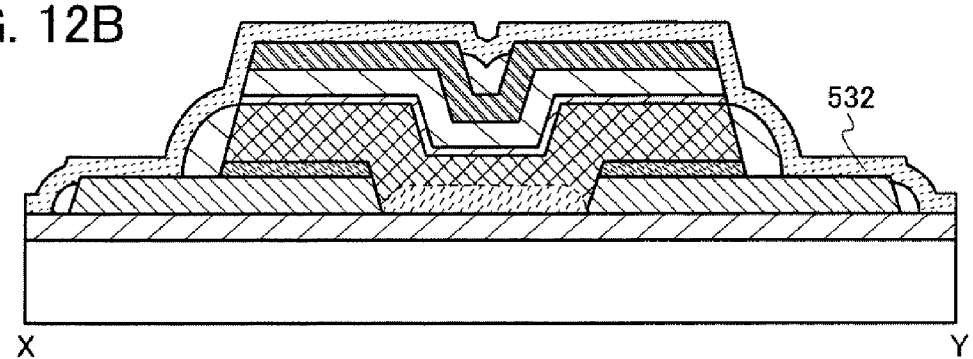

Next, a third conductive film 532 is formed so as to be electrically connected to at least the first wiring layer 504 (FIG. 12B).

Figure 12C:
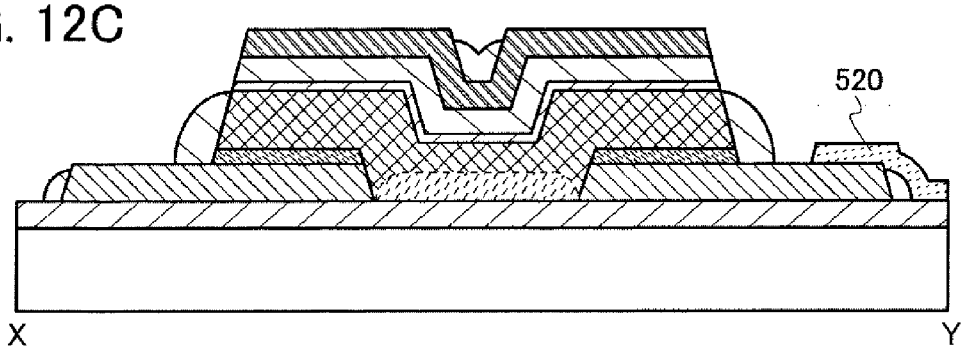

Next, the third conductive film 532 is processed by a photolithography method into the third wiring layer 520 (FIG. 12C). In this step, a third photomask is used.

As described above, a pixel TFT can be fabricated. As described above, the TFT can be fabricated with two photomasks. Furthermore, the pixel TFT can be fabricated with three photomasks Embodiment 6

In this embodiment, an embodiment of the present invention which is different from Embodiment 1 to Embodiment 5 is described. Specifically, an embodiment is described in which an area where the second wiring layer serving as a gate electrode and a semiconductor layer are overlapped with each other is made to be smaller without increasing the number of photomasks from that of Embodiment 5.

In this embodiment, a "reduced resist mask" is formed in such a manner that the resist mask used for processing the semiconductor film 522, the first insulating film 524, the second insulating film 526, and the second conductive film 528 in Embodiment 5 is reduced. The second wiring layer 514 is formed using this "reduced resist mask."

The area where the second wiring layer 514 and the semiconductor layer 508 are overlapped with each other can be made smaller by the "reduced resist mask." The second wiring layer 514 is formed using the "reduced resist mask;" thus, leakage current generated between the semiconductor layer 508 and the second wiring layer 514 through the sides of the first insulating layer 510 and the second insulating layer 512 can be reduced. Moreover, leakage current generated between the first wiring layer 504 and the second wiring layer 514 through the sides of the first insulating layer 510 and the second insulating layer 512 can be reduced.

Figure 13A:
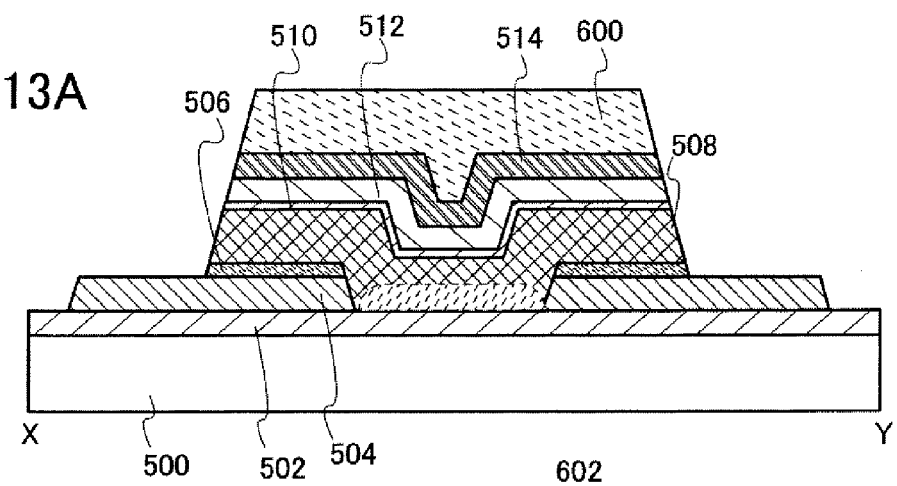
FIGS. 13A to 13D show one example of a fabrication method of a TFT of Embodiment 6.
Figure 13B:
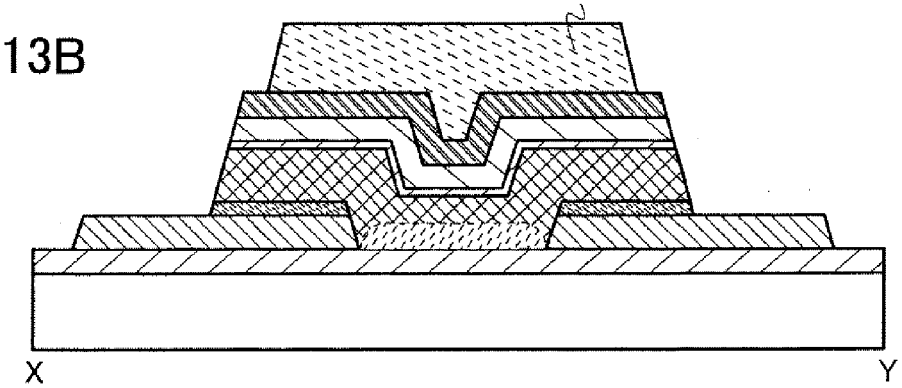

First, steps up to the formation of the semiconductor layer 508 and the first insulating layer 510, and the second insulating layer 512 and the second wiring layer 514 are performed as shown above in FIG. 11C (FIG. 13A). Next, a resist mask 600 used in the above steps is size-reduced, and a reduced resist mask 602 is formed (FIG. 13B).

As a method for forming the reduced resist mask 602 by size-reducing the resist mask 600, oxygen plasma ashing can be used, for example.

Figure 13C:
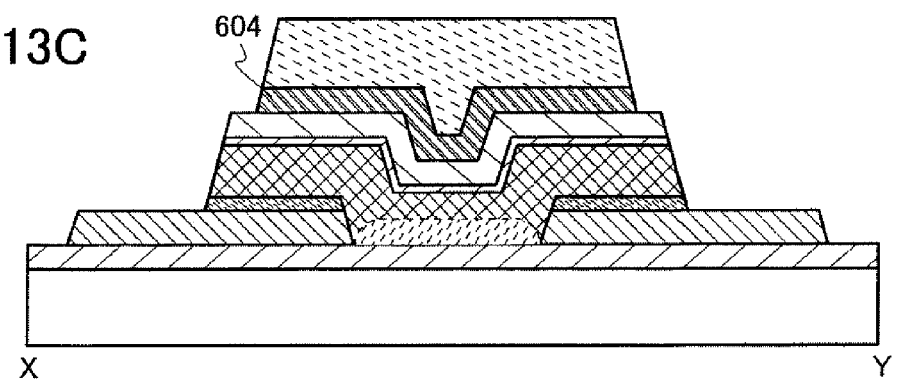
Figure 13D:
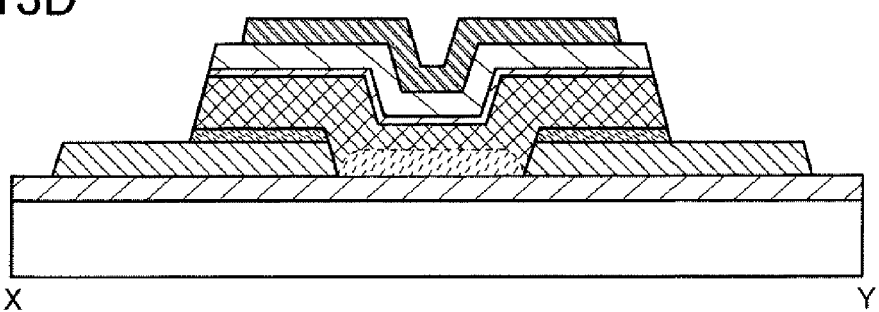

Next, the second wiring layer 514 is etched using the reduced resist mask 602, and a second wiring layer 604, which is a reduced second wiring layer 514, is formed (FIG. 13C). After that, the reduced resist mask 602 is removed (FIG. 13D).

As described above, a TFT of this embodiment can be fabricated.

The TFT is fabricated in a manner described in this embodiment; thus, leakage current of the TFT can be reduced without increasing the number of photomasks to be used.

Embodiment 7

In this embodiment, an embodiment of the present invention which is different from Embodiment 1 to Embodiment 6 is described. Specifically, an insulating layer is formed covering the TFT of Embodiment 5, and a wiring layer serving as a pixel electrode is formed over the insulating layer.

Figure 14A:
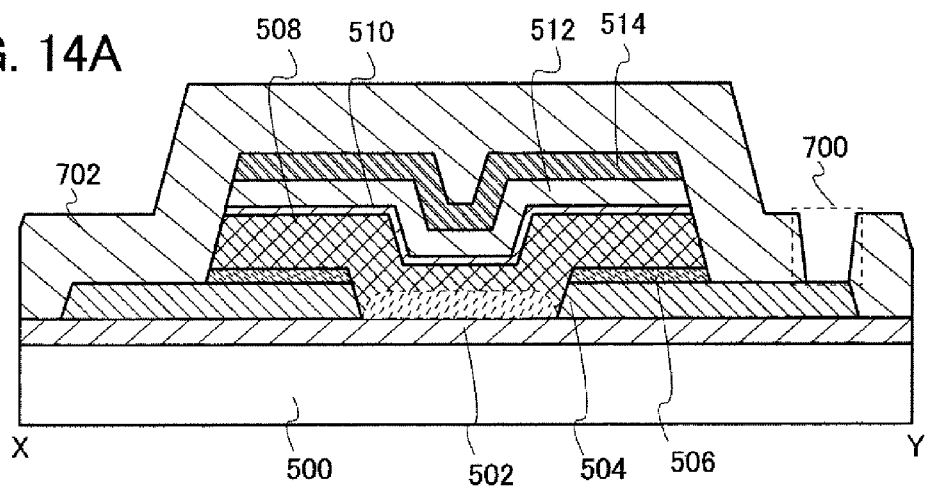
FIGS. 14A to 14C show one example of a fabrication method of a TFT of Embodiment 7.
Figure 14B:
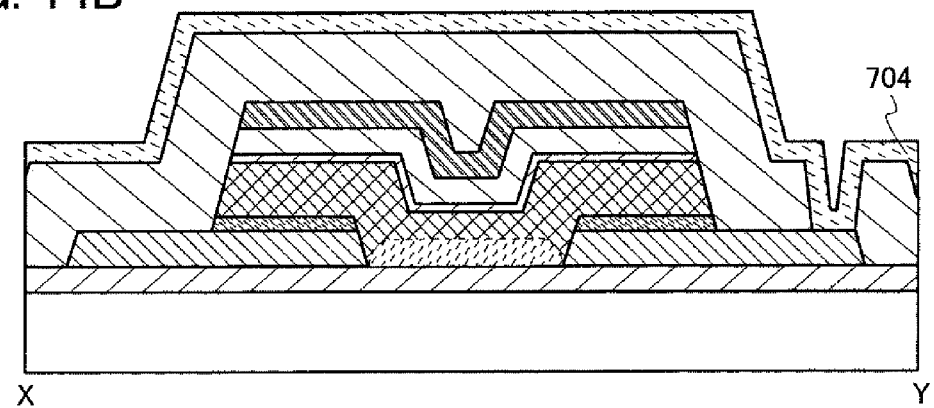
Figure 14C:
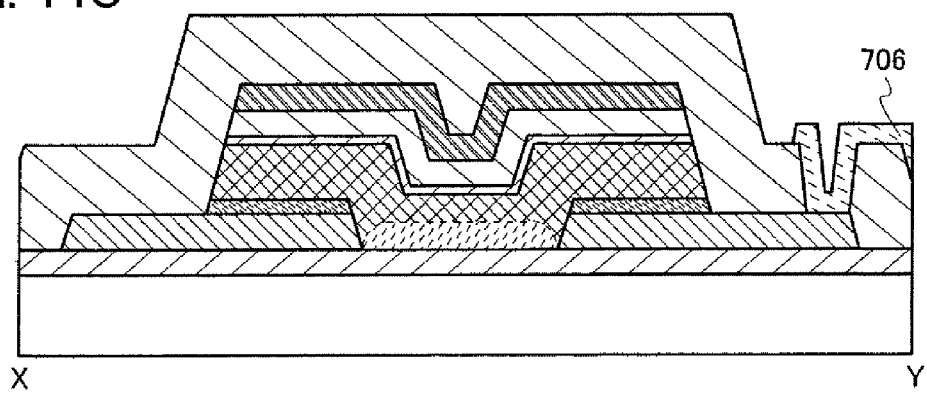

First, steps up to the formation of the insulating film 530 are performed as described above with reference to FIG. 11D. Next, an insulating layer 702 is formed in such a manner that the insulating film 530 is selectively etched and an opening 700 is formed in the insulating film 530 (FIG. 14A). Next, a third conductive film 704 is formed so as to be electrically connected to at least the first wiring layer 504 (FIG. 14B). Next, the third conductive film 704 is processed by a photolithography method into a third wiring layer 706 (FIG. 14C).

As described above, the pixel TFT of this embodiment can be fabricated.

A pixel TFT may be fabricated in the manner described in this embodiment. Note that one more photomask is needed in this embodiment. Therefore, the pixel TFT can be fabricated with four photomasks.

Embodiment 8

In this embodiment, an embodiment of the present invention which is different from Embodiment 1 to Embodiment 7 is described. Specifically, effect of photocurrent can be suppressed by providing a light blocking layer between the TFT and the substrate in Embodiment 5.

Figure 15A:
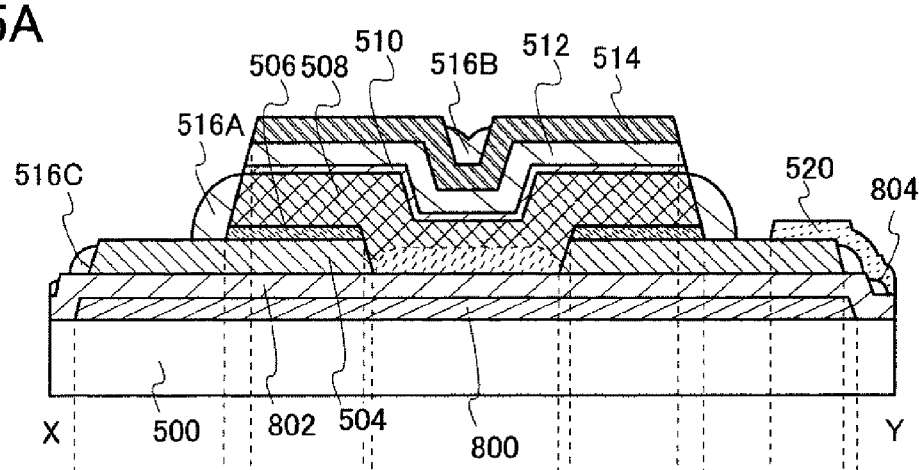
FIGS. 15A and 15B show examples of a cross-sectional view and a top view of a TFT of Embodiment 8.
Figure 15B:
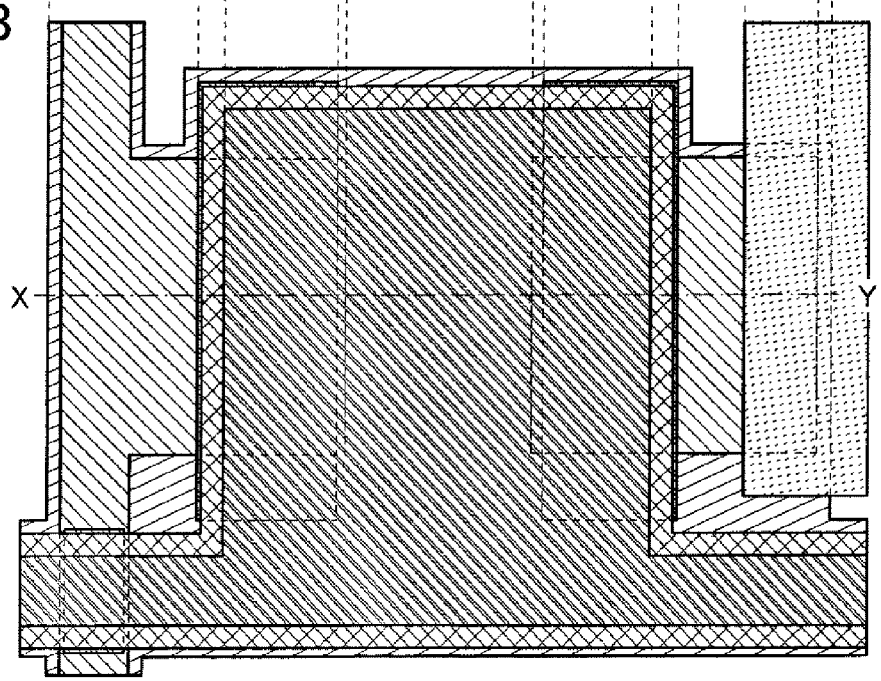

FIGS. 15A and 15B show a pixel TFT of this embodiment. That is, the pixel TFT shown in FIGS. 15A and 15B includes a light blocking layer 800 provided over the substrate 500 and overlapped with the entire surface of the TFT, a base layer 802 provided covering the light blocking layer 800, a first wiring layer 504 over the base layer 802, an impurity semiconductor layer 506 provided over part of the first wiring layer 504, a semiconductor layer 508 at least part of which is electrically connected with the first wiring layer 504 through the impurity semiconductor layer 506, a first insulating layer 510 over the semiconductor layer 508, a second insulating layer 512 over the first insulating layer 510, a second wiring layer 514 provided over the second insulating layer 512 and overlapped with at least part of the impurity semiconductor layer 506 and a region between a source region and a drain region formed using the impurity semiconductor layer 506 (including a channel formation region of the semiconductor layer 508), a side wall insulating layer 516A provided covering at least the side of the semiconductor layer 508, and a third wiring layer 520 electrically connected to the first wiring layer 504. That is, the TFT shown in FIGS. 15A and 15B is a top-gate staggered TFT that is similar to the TFT of Embodiment 5 shown in FIGS. 10A and 10B.

Note that, in the TFT shown in FIGS. 15A and 15B, a side wall insulating layer 516B is provided in a depression of the second wiring layer 514, and a side wall insulating layer 516C is provided in contact with at least the side of the first wiring layer 504. Furthermore, a side wall insulating layer 804 is provided in contact with a step of the base layer 802 provided over the light blocking layer 800.

Note that the depression of the second wiring layer 514 is formed due to the thickness of the first wiring layer 504 and the impurity semiconductor layer 506. The side wall insulating layer 516B, the side wall insulating layer 516C, and the side wall insulating layer 804 can improve the coverage of the first wiring layer 504 and the second wiring layer 514 with a thin film provided thereover, so that disconnection of the wiring can be prevented, for example. The side wall insulating layer 516B, the side wall insulating layer 516C, and the side wall insulating layer 804 can be formed at the same time as the side wall insulating layer 516A.

Note that the side wall insulating layer 516A, the side wall insulating layer 516B, the side wall insulating layer 516C, and the side wall insulating layer 804 are not necessarily provided.

The light blocking layer 800 may be formed using a similar material and in a similar manner to those of the light blocking layer 400 in Embodiment 4.

Note that the base layer 802 may be formed using a similar material and in a similar manner to those of the base layer 102 in Embodiment 1.

Note that although the light blocking layer 800 is provided so as to overlap with the entire surface of the TFT in FIG. 15A, the structure is not limited to this. The light blocking layer 800 may be formed so as to shield at least the semiconductor layer 508 from light.

Note that the light blocking layer 800 is provided over and in contact with the substrate 500 in FIG. 15A; however, the structure is not limited to this. Another base film may be provided between the substrate 500 and the light blocking layer 800. When another base film is formed between the substrate 500 and the light blocking layer 800, it can be prevented that the substrate 500 is also etched by a process (e.g., a dry etching) performed for formation of the light blocking layer 800.

As described above, a pixel TFT of this embodiment can be fabricated.

A pixel TFT may be fabricated in the manner described in this embodiment. Note that one more photomask is needed in this embodiment. Therefore, the pixel TFT can be fabricated with four photomasks.

Embodiment 9

The TFT described in Embodiment 1 to Embodiment 8 can also be applied to a protect circuit portion of a display device. A protect circuit portion of a display device can be formed using a plurality of diode-connected TFTs, for example.

Figure 16A:
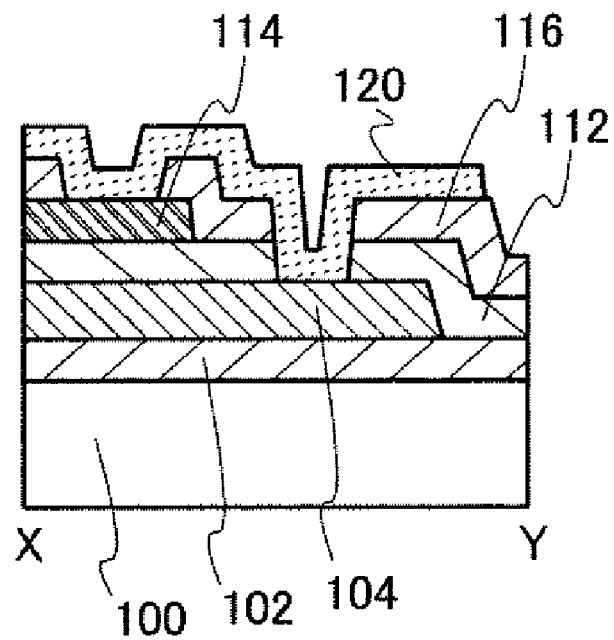
FIGS. 16A and 16B show structures of Embodiment 9.

FIG. 16A shows a structure of a connected portion in which the TFT in FIGS. 1A and 1B is diode-connected using the third wiring layer 120. As is illustrated, the first wiring layer 104 and the second wiring layer 114 are connected to each other through the third wiring layer 120 to form a diode connection.

Figure 16B:
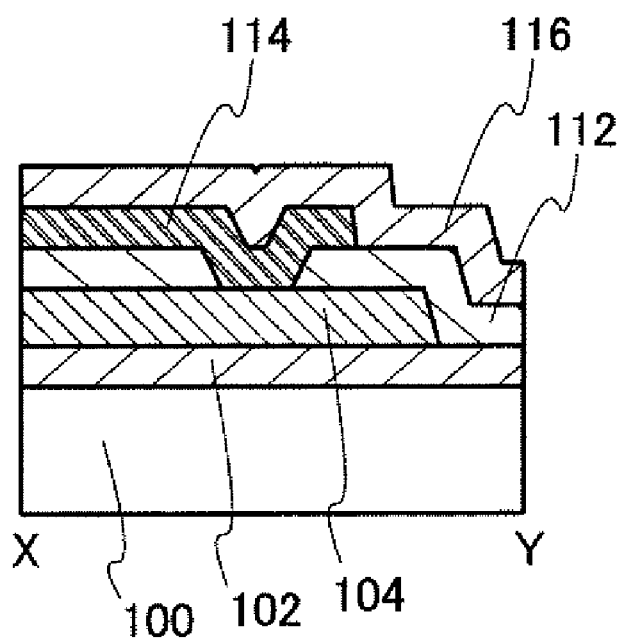

However, the third wiring layer 120 is often more inconvenient than the first wiring layer 104 and the second wiring layer 114 from the viewpoint of wiring resistance and the like because the third wiring layer 120 serves as a pixel electrode. Therefore, as shown in FIG. 16B, the first wiring layer 104 and the second wiring layer 114 may be connected to each other through an opening formed in the second insulating layer 112. The diode connection is formed as shown in FIG. 16B; thus, wiring delays can be prevented.

Note that when diode connection is formed as shown in FIG. 16B, one more photomask is needed. Therefore, when the structure shown in FIG. 16B is applied to that of Embodiment 1, seven photomasks are needed in a fabrication process of the pixel TFT. When the structure shown in FIG. 16B is applied to that of Embodiment 5, four photomasks are needed in a fabrication process of the pixel TFT.

Embodiment 10

The TFTs described in Embodiment 1 to Embodiment 8 can be applied to an array substrate of a display device. Electronic appliances including a display device to which the TFTs described in Embodiment 1 to Embodiment 8 are applied can be fabricated. Examples of the electronic appliances include a television set (also referred to as a television or a television receiver), a monitor of a computer, an electronic paper, a digital camera, a digital video camera, a digital photo frame, a cellular phone set (also referred to as a cellular phone or a cellular phone device), a portable game machine, a portable information terminal, an audio replay device, a large-sized game machine such as a pachinko machine, or the like. Note that electronic appliances of this embodiment may have the structure described in Embodiment 9.

The display device in which the pixel TFT described in the above embodiments is used can be applied to an electronic paper, for example. An electronic paper can be used for electronic appliances of a variety of fields for displaying data. For example, an electronic paper can be used for electronic book readers (e-book readers), posters, advertisements in vehicles such as trains, a display portion provided in a variety of cards such as credit cards, and so on.

Figure 17A:
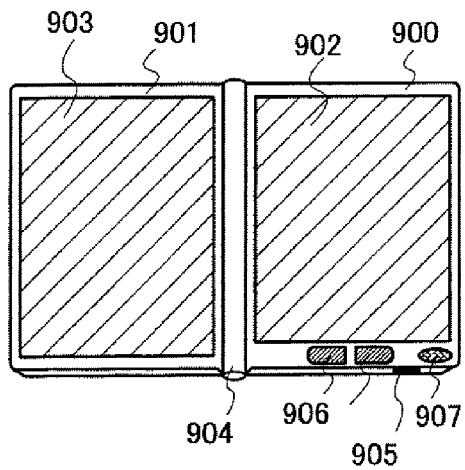
FIGS. 17A to 17D show electronic appliances of Embodiment 10.

FIG. 17A shows an example of an electronic book reader. The electronic book reader illustrated in FIG. 17A includes a housing 900 and a housing 901. The housing 900 and the housing 901 are connected with a hinge 904 so that the electronic book reader shown in FIG. 17A can be opened and closed and can be handled like a paper book.

A display portion 902 is incorporated in the housing 900, and a display portion 903 is incorporated in the housing 901. The display portion 902 and the display portion 903 may display one image together or may display different images. In the structure where different images are displayed on the display portion 902 and the display portion 903, the right display portion (the display portion 902 in FIG. 17A) can display text and the left display portion (the display portion 903 in FIG. 17A) can display pictures, for example. The display device in which the pixel TFT described in the above embodiments is used can be applied to the display portion 902 and the display portion 903.

In FIG. 17A, the housing 900 includes a power supply input terminal 905, operation keys 906, and a speaker 907. The operation keys 906 may have a function of turning pages, for example. Note that a keyboard, a pointing device, or the like may be provided on the same surface as the display portion of the housing, or an external connection terminal (an earphone terminal, a USB terminal, a terminal which can be connected to a variety of cables such as a USB cable, or the like), or a recording medium insertion portion may be provided on the back surface or the side surface of the housing. Note that, the electronic book reader illustrated in FIG. 17A may further have a structure with which data can be sent and received wirelessly.

Figure 17B:
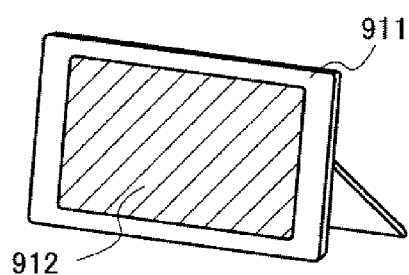

FIG. 17B illustrates an example of a digital photo frame. In the digital photo frame illustrated in FIG. 17B, a display portion 912 is incorporated in a housing 911. The display device in which the pixel TFT described in the above embodiments is used can be applied to the display portion 912.

Note that the digital photo frame illustrated in FIG. 17B may be provided with an operation portion, an external connection terminal (a USB terminal, a terminal which can be connected to a variety of cables such as a USB cable, or the like), a recording medium insertion portion, or the like. Although they may be provided on the same surface as the display portion, it is preferable to provide them on the back surface or the side surface to improve its design. For example, a recording medium storing data of an image shot with a digital camera is inserted in the recording medium insertion portion of the digital photo frame, whereby the image data can be downloaded and displayed on the display portion 912. Note that the digital photo frame illustrated in FIG. 17B may be configured to transmit and receive data wirelessly.

Figure 17C:
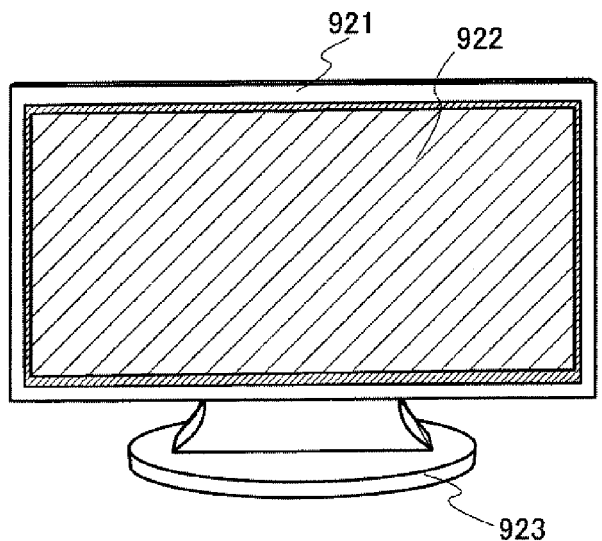

FIG. 17C shows an example of a television set. In the television set illustrated in FIG. 17C, a display portion 922 is incorporated in a housing 921, and the housing 921 is supported by a stand 923. The display device in which the pixel TFT described in the above embodiments is used can be applied to the display portion 922.

The television set illustrated in FIG. 17C can be operated with an operation switch of the housing 921 or a separate remote control. Channels and volume can be controlled by an operation key of the remote control, so that an image to be displayed on the display portion 922 can be chosen. Further, the remote control may be provided with a display portion for displaying data output from the remote control.

Note that the television set illustrated in FIG. 17C is provided with a receiver, a modem, and the like. The receiver makes it possible to receive a general television broadcast. Furthermore, when the television set is connected to a wired or wireless communication network via the modem, one-way (from a transmitter to a receiver) or two-way (between a transmitter and a receiver, between receivers, or the like) data communication can be performed.

Figure 17D:
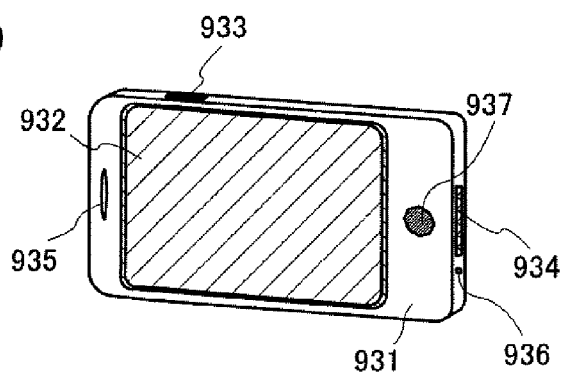

FIG. 17D shows an example of a cellular phone set. The cellular phone set illustrated in FIG. 17D is provided with a display portion 932 incorporated in a housing 931, an operation button 933, an operation button 937, an external connection port 934, a speaker 935, a microphone 936, or the like. The display device to which the pixel TFT described in the above embodiments is used can be applied to the display portion 932.

In the cellular phone set illustrated in FIG. 17D, the display portion 932 may be a touch screen. In this case, making phone calls, writing mails, and the like can be performed by using the display portion 932 as a touch screen.

The display portion 932 mainly has three screen modes. The first mode is a display mode mainly for displaying images. The second mode is an input mode mainly for inputting data such as text. The third mode is a display/input mode in which two modes of the display mode and the input mode are combined.

For example, in the case of making phone calls or writing mails, a text input mode mainly for inputting text is selected as a screen mode of the display portion 932 and operation for inputting text displayed on the screen may be performed. In this case, it is preferable to display a keyboard or number buttons on almost the entire screen of the display portion 932.

When a detection device including a sensor for detecting inclination, such as a gyroscope or an acceleration sensor, is provided inside the cellular phone set illustrated in FIG. 17D, display data for the display portion 932 can be automatically switched according to the orientation of the cellular phone set (whether the cellular phone set is placed horizontally or vertically for a landscape mode or a portrait mode).

Switching of the screen modes may be performed by contact with the display portion 932 or by operation of the operation button 937 of the housing 931; alternatively, the screen is switched according to kinds of the data displayed on the display portion 932.

In the case where touch operation for the display portion 932 is not input for a certain period when the screen mode is set to the input mode, the screen mode may be changed from the input mode to the display mode.

The display portion 932 can also function as an image sensor. For example, an image of a palm print, a fingerprint, or the like is taken by the image sensor by touching the display portion 932 with a palm or a finger, whereby personal authentication can be performed. Further, by providing a backlight or a sensing light source which emits near-infrared light to the display portion, an image of finger veins, palm veins, or the like can be taken.

As described above, the TFT and the display device described in the above embodiments can be applied to a variety of electronic appliances.

Figure 18:
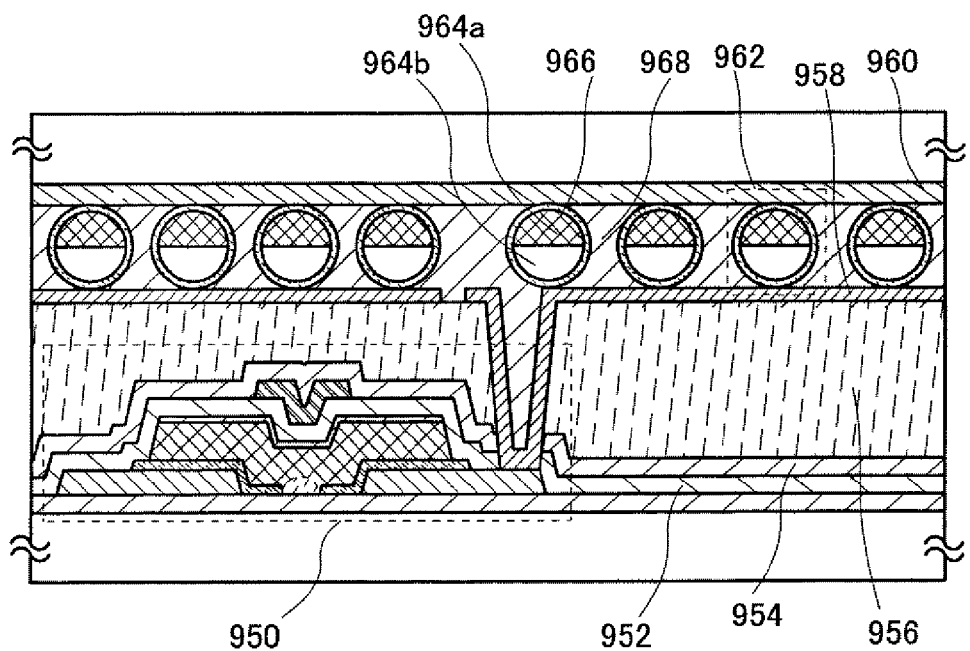
FIG. 18 illustrates an electronic paper of Embodiment 10.

Meanwhile, FIG. 18 is a cross-sectional view of an active matrix electronic paper.

The electronic paper of FIG. 18 is an example of a display device in which a twisting ball display system is employed. The twisting ball display system refers to a method in which spherical particles each colored in black and white are used for a display element and are arranged between a first electrode and a second electrode, and a potential difference is generated between the first electrode and the second electrode to control orientation of the spherical particles, so that display is performed.

The TFT 950 is the top gate TFT illustrated in FIGS. 1A and 1B. A third wiring layer 958 forming a first electrode is electrically connected to a source electrode or a drain electrode of the TFT 950 through an opening formed in a second insulating layer 952, a third insulating layer 954, and a resin layer 956 serving as a fourth insulating layer. The third insulating layer 954 is provided covering the TFT 950.

A spherical particle 962 is provided between the third wiring layer 958 and a counter electrode layer 960, and includes a cavity 966, a black region 964a, and a white region 964b. A space around the spherical particle 962 is filled with a filler 968 such as resin (FIG. 18). The third wiring layer 958 corresponds to a pixel electrode, and the counter electrode layer 960 corresponds to a common electrode. The counter electrode layer 960 is electrically connected to a common potential line provided over the same substrate as the TFT 950. At a common connection portion, the counter electrode layer 960 can be electrically connected to the common potential line through conductive particles provided between a pair of substrates.

Further, an electrophoretic element can also be used instead of the twisting ball. A microcapsule having a diameter of about 10 μm to 200 μm in which transparent liquid, positively charged white microparticles, and negatively charged black microparticles are encapsulated, is used. In the microcapsule, when a potential difference is generated between the pixel electrode and the counter electrode, white microparticles and black microparticles move in the opposite direction to each other, whereby black or white display can be performed. The electrophoretic display element has higher reflectivity than a liquid crystal display element, and thus, a light source is unnecessary, power consumption is low, and display can be read in a dim place. In addition, even when power is not supplied to the display portion, an image which has been displayed once can be maintained. Accordingly, in the case where the electronic paper has a structure in which a signal and electric power are wirelessly supplied from an electric wave source, a displayed image can be maintained even if the electronic paper is distanced from the electric wave source.

An electronic paper can be fabricated using the TFT described in any of the above embodiments as its switching element. For example, an electronic paper can be used for the electronic book reader illustrated in FIG. 17A.

This application is based on Japanese Patent Application serial no. 2009-297892 filed with Japan Patent Office on Dec. 28, 2009, the entire contents of which are hereby incorporated by reference.

What is claimed is:

1. A thin film transistor comprising:
a light blocking layer over a substrate;
a base layer over the light blocking layer;
a first wiring layer over the base layer;
an impurity semiconductor layer over the first wiring; and
a semiconductor layer over the impurity semiconductor layer, wherein the semiconductor layer comprises a crystalline region and a region containing an amorphous phase,
wherein the region containing the amorphous phase is located between the base layer and the crystalline region.

2. The thin film transistor according to the claim 1,
wherein the base layer comprises a material selected from the group of silicon oxide, silicon nitride, silicon oxynitride and silicon nitride oxide.

3. The thin film transistor according to the claim 1,
wherein the semiconductor layer contains a material selected from the group of nitrogen, an NH group and an $NH_2$ group.

4. A display device comprising the thin film transistor according to the claim 1,
wherein the display device is incorporated into one selected from the group consisting of a television, a monitor of a computer, an electronic paper, a digital camera, a digital video camera, a digital photo frame, a cellular phone, a portable game machine, a portable information terminal, an audio replay device and a large-sized game machine such as a pachinko machine.

5. A thin film transistor comprising:
a light blocking layer over a substrate;
a base layer over the light blocking layer;
a first wiring layer over the base layer;
a side wall insulating layer in contact with a side surface of the first wiring layer;
an impurity semiconductor layer over the first wiring; and
a semiconductor layer over the impurity semiconductor layer, wherein the semiconductor layer comprises a crystalline region and a region containing an amorphous phase,
wherein the region containing the amorphous phase is located between the base layer and the crystalline region.

6. The thin film transistor according to the claim 5,
wherein the base layer comprises a material selected from the group of silicon oxide, silicon nitride, silicon oxynitride and silicon nitride oxide.

7. The thin film transistor according to the claim 5,
wherein the semiconductor layer contains a material selected from the group of nitrogen, an NH group and an $NH_2$ group.

8. A display device comprising the thin film transistor according to the claim 5,
wherein the display device is incorporated into one selected from the group consisting of a television, a monitor of a computer, an electronic paper, a digital camera, a digital video camera, a digital photo frame, a cellular phone, a portable game machine, a portable information terminal, an audio replay device and a large-sized game machine such as a pachinko machine.

* * * * *